United States Patent
Ray et al.

(10) Patent No.: US 9,954,561 B2
(45) Date of Patent: Apr. 24, 2018

(54) SYSTEMS AND METHODS FOR PARALLELIZING AND PIPELINING A TUNABLE BLIND SOURCE SEPARATION FILTER

(71) Applicants: THE BOEING COMPANY, Chicago, IL (US); HRL LABORATORIES, Malibu, CA (US)

(72) Inventors: Gary Alan Ray, Issaquah, WA (US); Peter Petre, Oak Park, CA (US); Charles E. Martin, Thousand Oaks, CA (US); Shankar R. Rao, Agoura Hills, CA (US)

(73) Assignees: THE BOEING COMPANY, Chicago, IL (US); HRL LABORATORIES, Malibu, CA (US)

( * ) Notice: Subject to any disclaimer, the term of this patent is extended or adjusted under 35 U.S.C. 154(b) by 0 days.

(21) Appl. No.: 15/263,016

(22) Filed: Sep. 12, 2016

(65) Prior Publication Data
US 2018/0076835 A1    Mar. 15, 2018

(51) Int. Cl.
*H04B 1/719*    (2011.01)
*H04B 1/7163*    (2011.01)
(Continued)

(52) U.S. Cl.
CPC ......... *H04B 1/0053* (2013.01); *H04B 1/1638* (2013.01)

(58) Field of Classification Search
CPC ... H04L 1/0038; H04L 25/0307; H04B 7/024; G01S 7/021
See application file for complete search history.

(56) References Cited

U.S. PATENT DOCUMENTS 5,179,529 A * 1/1993 Nowakowski ........ G06F 17/144
708/404
5,263,051 A    11/1993 Eyuboglu
(Continued)

FOREIGN PATENT DOCUMENTS

EP    2988148 A1    2/2016

OTHER PUBLICATIONS

Lan-Da Van, Pipelining and Parallel Processing, Department of Computer Science National ChiaoTung University, Taiwan, 2010.*
(Continued)

*Primary Examiner* — Aristocratis Fotakis
(74) *Attorney, Agent, or Firm* — Armstrong Teasdale LLP

(57) ABSTRACT

A method of processing a plurality of time-varying signals received at a sensor communicatively coupled to a signal data processor to identify at least one parameter of at least one of the plurality of time-varying signals is provided. The method includes receiving, at a plurality of blind source separation (BSS) modules of the signal data processor, signals derived from the plurality of time-varying signals, each BSS module of the plurality of BSS modules including a filtering subsystem having a pipelined architecture and a parallelized architecture. The method also includes generating a plurality of blind source separated signals, and transmitting at least one pulse descriptor word (PDW) parameter vector signal to a computing device of the signal data processor. The method further includes identifying the at least one parameter from the at least one PDW parameter vector signal, and outputting the at least one parameter from the signal data processor.

20 Claims, 12 Drawing Sheets

(51) Int. Cl.
*H04B 1/00* (2006.01)
*H04B 1/16* (2006.01)

(56) References Cited

U.S. PATENT DOCUMENTS

| | | | |
|---|---|---|---|
| 5,754,783 A | 5/1998 | Mendelson et al. | |
| 5,889,791 A | 3/1999 | Yang | |
| 5,999,129 A | 12/1999 | Rose | |
| 6,041,393 A | 3/2000 | Hsu | |
| 6,043,771 A * | 3/2000 | Clark | G01S 7/021 342/13 |
| 6,147,646 A * | 11/2000 | Arneson | G01S 3/28 342/13 |
| 6,205,190 B1 | 3/2001 | Antonio et al. | |
| 6,285,319 B1 | 9/2001 | Rose | |
| 6,351,456 B1 | 2/2002 | Struhsaker et al. | |
| 6,744,744 B1 | 6/2004 | Tong et al. | |
| 6,931,362 B2 * | 8/2005 | Beadle | G06K 9/624 702/189 |
| 6,985,102 B1 * | 1/2006 | Horn | G01S 7/021 342/13 |
| 8,805,858 B1 | 8/2014 | Ray | |
| 9,749,007 B1 * | 8/2017 | Martin | H04B 1/719 |
| 2002/0035709 A1 | 3/2002 | Chen et al. | |
| 2002/0121890 A1 * | 9/2002 | Levitt | G01R 23/175 324/76.36 |
| 2002/0168035 A1 * | 11/2002 | Carlson | G06F 17/15 375/343 |
| 2003/0023909 A1 | 1/2003 | Ikeda et al. | |
| 2003/0079170 A1 | 4/2003 | Stewart et al. | |
| 2003/0095716 A1 | 5/2003 | Gindele et al. | |
| 2003/0221084 A1 | 11/2003 | Zhou | |
| 2004/0027257 A1 * | 2/2004 | Yannone | G01S 11/04 340/945 |
| 2005/0060142 A1 * | 3/2005 | Visser | G10L 21/0208 704/201 |
| 2006/0069531 A1 * | 3/2006 | Goldberg | H04B 7/0854 702/190 |
| 2008/0198914 A1 * | 8/2008 | Song | H03H 17/0261 375/232 |
| 2010/0309055 A1 | 12/2010 | Middour et al. | |
| 2012/0280848 A1 * | 11/2012 | Card | G01S 7/42 342/13 |
| 2013/0021197 A1 * | 1/2013 | Jiang | G01S 7/021 342/195 |

OTHER PUBLICATIONS

Mark Wickert, ECE2610 Signals and Systems lecture notes, Chapter 8 IIR Filters, Apr. 19, 2010.
A. Kurzhanskiy & P. Varaiya, Ellipsoidal Toolbox Technical Report, 2006.
M. Friendly et al., Elliptical Insights: Understanding Statistical Methods through Elliptical Geometry, Statistical Science, vol. 28, No. 1, 1-39 (2013).
An FPGA Implementation of Incremental Clustering for Radar Pulse Deinterleaving, Scott Bailie, MS Thesis, Northeastern Univ., Apr. 2010.
S. Bailie & M. Leeser, Incremental applied to radar deinterleaving: a parameterized FPGA implementation, FPGA '12 Proceedings of the ACM/SIGDA international symposium on Field Programmable Gate Arrays, pp. 25-28, ISBN 978-1-4503-1155-7, abstract available at http://dl.acm.org/citation.cfm?id=2145699, 2012.
Pandu, J., Balaji, N., Naidu, C.D., FPGA implementation of multi parameter deinterleaving, 2014 International Conference on Electronics and Communications Systems (ICECS), Feb. 13-14, 2014, ISBN 978-1-4799-2320-5, abstract available at http://ieeexplore.ieee.org/document/6892676/.
Singh, A.K. & Rao, K.S., Detection, Identification & Classification of Intra Pulse Modulated LPI Radar Signal using Digital Receiver, International Journal of Emerging Technology and Advanced Engineering, vol. 2, Issue 9, Sep. 2012.
Kumar.N et al., Deinterleaving of Radar Signals and its Parameter Estimation in EW Environment, International Journal of Emerging Technology and Advanced Engineering, vol. 4, Issue 9, Sep. 2014.
Mahmoud et al., Radar Parameter Generation to Identify the Target, Journal of Engineering, vol. 17, Feb. 2011, available at http://www.iasj.net/iasj?func=fulltext&ald=24384.
Babcock et al., Sampling From a Moving Window Over Streaming Data, SODA '02 Proceedings of the thirteenth annual ACM-SIAM symposium on Discrete algorithms, pp. 633-634, abstract available at http://dl.acm.org/citation.cfm?id=545465, 2002.
Lakshmi et al., Detection and Extraction of Radio Frequency and Pulse Parameters in Radar Warning Receivers, Proceedings of International Conference on Emerging Research in Computing, Information , Communication an Applications (ERCICA 2013), Aug. 2013, ISBN 978-9-3510-7102-0, available at http://searchdl.org/public/book_series/elsevierst/1/97.pdf.
Guassianwaves.com—Signal Processing Simplified, Interleavers and deinterleavers, Oct. 25, 2010, http://www.gaussianwaves.com/2010/10/interleavers-and-deinterleavers-2/.
J.D. Parker, Deinterleaver Technology for Future Electronic Support Measures (ESM) Systems, Naval Surface Warfare Center, Dec. 1992, available at http://www.dtic.mil/dtic/tr/fulltext/u2/a265005.pdf.
SysBrain, User's Manual—Reference of the Geometric Bounding Toolbox (GBT) Version 7.3, http://www.sysbrain.com/gbt/gbt/gbt7man.pdf, 2004.
K. Fischer et al., Computational Geometry Algorithms Library (CGAL), Reference Manual, Bounding Volumes Reference, http://doc.cgal.org/latest/Bounding_volumes/group_PkgBoundingVolumes.html, 2016.
U.S. Appl. No. 15/073,626, filed Mar. 17, 2016.
EPO Extended Search Report for related application 17181686.1 dated Aug. 21, 2017, 9 pp.
EPO Extended Search Report for related application 17181675.4 dated Aug. 17, 2017, 11 pp.
EP Extended Search Report for related application 17174816.3 dated Jan. 9, 2018, 7 pp.
Li Jiang et al., Pulse-compression radar signal sorting using the blind source separation algorithms, 2015 International conference on Estimation, Detection and Information Fusion (ICEDIF), IEEE, Jan. 10, 2015, pp. 268-271, XP033219149.
Kuo-Kai Shyu et al., Implementation of Pipelined Fast ICA on FRGA for Real-Time Blind Source Separation, IEEE Transactions on Neural Networks, IEEE Service Center, Piscataway, NJ, US, vol. 19, No. 6, Jun. 1, 2008, pp. 358-970, XP011225997, ISSN: 1045-9227.

* cited by examiner

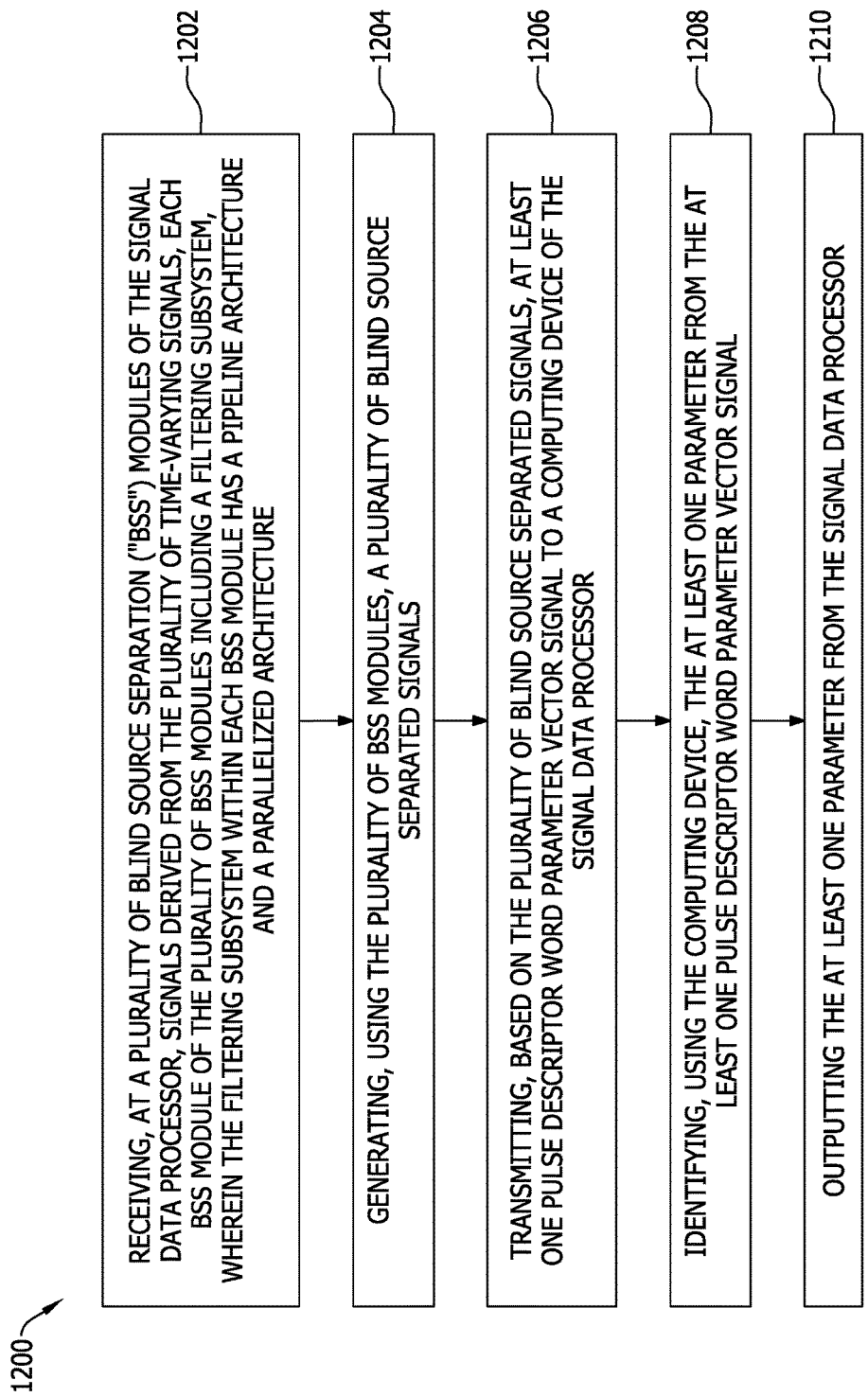

SYSTEMS AND METHODS FOR PARALLELIZING AND PIPELINING A TUNABLE BLIND SOURCE SEPARATION FILTER

STATEMENT REGARDING FEDERALLY SPONSORED RESEARCH & DEVELOPMENT

This invention was made with Government support under N00014-12-C-0027 awarded by the Department of Defense. The government has certain rights in this invention.

BACKGROUND

The field of the disclosure relates generally to separating and identifying signals of interest from a plurality of mixed signals, and, more specifically, to systems and methods for parallelizing and pipelining a tunable blind source separation filter.

In at least some known signal processing systems, a plurality of mixed signals (e.g., radar signals) are received by a sensor communicatively coupled to a blind source separation filter. Using signal processing techniques, the blind source separation filter attempts to accurately separate and identify signals of interest from the plurality of mixed signals. To improve performance, at least some known blind source separation filters use pipelining and paralleling techniques. However, pipelining and parallelizing filters typically require determining new filter coefficients for each tuned frequency, and utilizing relatively large look-up tables that require intensive memory and computational resources. Additionally, in at least some known systems, excessive hardware latencies (e.g., due to clock cycles) encountered during continuous generation, classification, and tracking may cause potential signals of interest to be misclassified or to not be included in signal tracking. Also, in at least some known signal filter tuning systems and methods, pipelining and parallelizing signal filtering requires substantially different circuit and hardware versions for use on various platforms.

BRIEF DESCRIPTION

In one aspect, a method of processing a plurality of time-varying signals received at a sensor communicatively coupled to a signal data processor to identify at least one parameter of at least one of the plurality of time-varying signals is provided. The method includes receiving, at a plurality of blind source separation (BSS) modules of the signal data processor, signals derived from the plurality of time-varying signals, each BSS module of the plurality of BSS modules including a filtering subsystem, where the filtering subsystem within each BSS module has a pipelined architecture and a parallelized architecture. The method also includes generating, using the plurality of BSS modules, a plurality of blind source separated signals, and transmitting, based on the plurality of blind source separated signals, at least one pulse descriptor word (PDW) parameter vector signal to a computing device of the signal data processor. The method further includes identifying, using the computing device, the at least one parameter from the at least one PDW parameter vector signal, and outputting the at least one parameter from the signal data processor.

In another aspect, a system for processing a plurality of time-varying signals to identify at least one parameter of at least one of the plurality of time-varying signals is provided. The system includes a sensor configured to receive the plurality of time-varying signals, and a signal data processor communicatively coupled to the sensor. The signal data processor includes a plurality of BSS modules, where each BSS module of the plurality of BSS modules includes a filtering subsystem. The filtering subsystem has a pipelined architecture and a parallelized architecture. The signal data processor is configured to receive, at the plurality of BSS modules, signals derived from the plurality of time-varying signals, and generate, using the plurality of BSS modules, a plurality of blind source separated signals. The signal data processor is also configured to transmit, based on the plurality of blind source separated signals, at least one PDW parameter vector signal to a computing device of the signal data processor. The signal data processor is further configured to identify, using the computing device, the at least one parameter from the at least one PDW parameter vector signal, and output the at least one parameter from the signal data processor.

In yet another aspect, a signal data processor for processing a plurality of time-varying signals to identify at least one parameter of at least one of the plurality of time-varying signals is provided. The signal data processor includes a plurality of BSS modules, where each BSS module of the plurality of BSS modules includes a filtering subsystem. The filtering subsystem has a pipelined architecture and a parallelized architecture. The signal data processor is configured to receive, at the plurality of BSS modules, signals derived from the plurality of time-varying signals, and generate, using the plurality of BSS modules, a plurality of blind source separated signals. The signal data processor is also configured to transmit, based on the plurality of blind source separated signals, at least one PDW parameter vector signal to a computing device of the signal data processor. The signal data processor is further configured to identify, using the computing device, the at least one parameter from the at least one PDW parameter vector signal, and output the at least one parameter from the signal data processor.

BRIEF DESCRIPTION OF THE DRAWINGS

These and other features, aspects, and advantages of the present disclosure will become better understood when the following detailed description is read with reference to the accompanying drawings in which like characters represent like parts throughout the drawings, wherein:

FIG. 12 is a flowchart of an exemplary method of processing a plurality of time-varying signals that may be used with signal processing system shown in FIG. 1.

Figure 1:
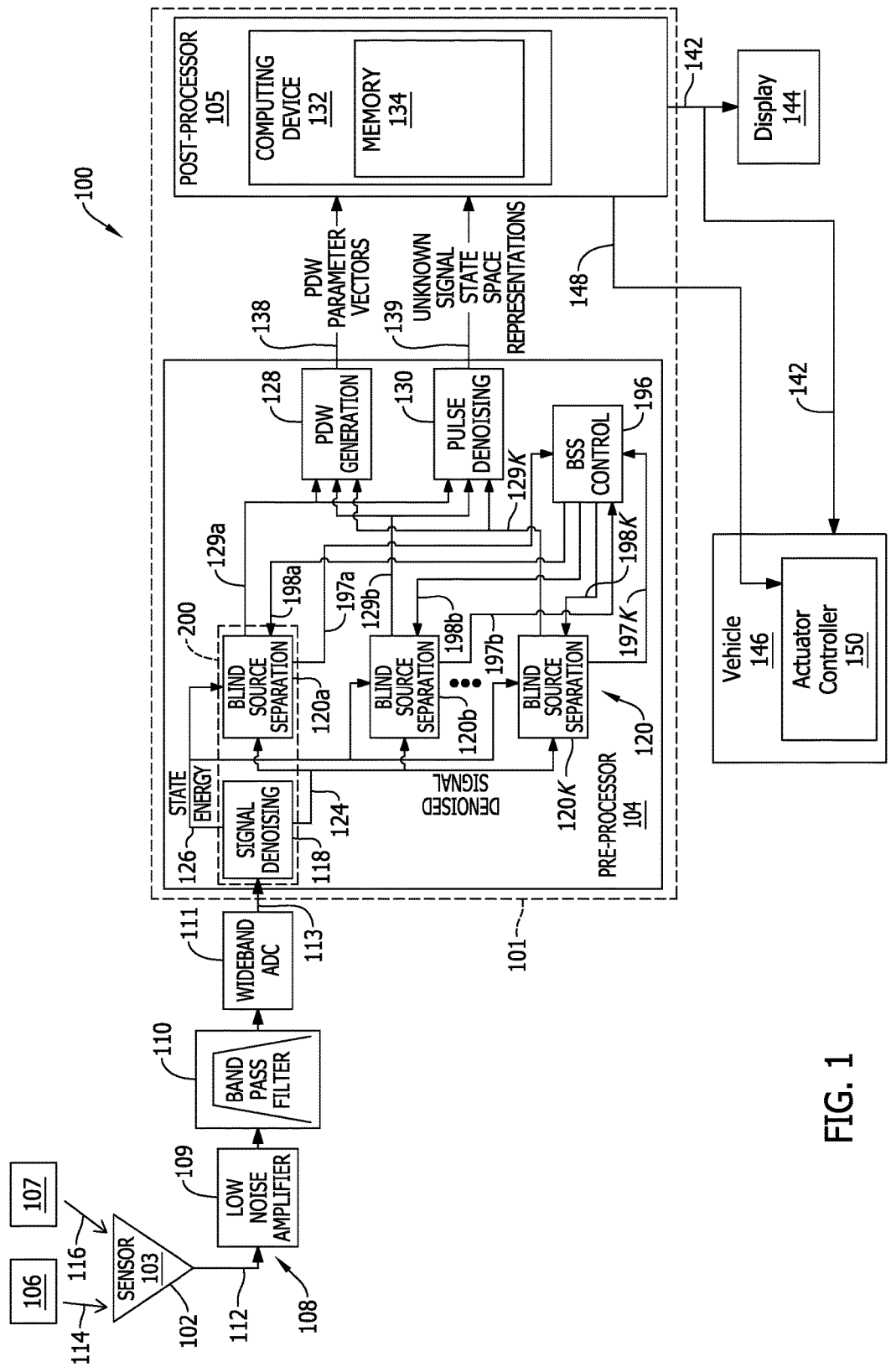
FIG. 1 is a schematic diagram of an exemplary signal processing system for generating pulse descriptor words (PDWs) using blind source separation (BSS).

Unless otherwise indicated, the drawings provided herein are meant to illustrate features of implementations of this disclosure. These features are believed to be applicable in a wide variety of systems comprising one or more implementations of this disclosure. As such, the drawings are not meant to include all conventional features known by those of ordinary skill in the art to be required for the practice of the implementations disclosed herein.

DETAILED DESCRIPTION

In the following specification and the claims, reference will be made to a number of terms, which shall be defined to have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately", and "substantially", are not to be limited to the precise value specified. In at least some instances, the approximating language may correspond to the precision of an instrument for measuring the value. Here and throughout the specification and claims, range limitations may be combined and/or interchanged, and such ranges are identified and include all the sub-ranges contained therein unless context or language indicates otherwise.

As used herein, the terms "processor" and "computer" and related terms, e.g., "processing device", "computing device", and "controller" are not limited to just those integrated circuits referred to in the art as a computer, but broadly refers to a microcontroller, a microcomputer, a programmable logic controller (PLC), an application specific integrated circuit (ASIC), and other programmable circuits, and these terms are used interchangeably herein. In the implementations described herein, memory may include, but is not limited to, a computer-readable medium, such as a random access memory (RAM), and a computer-readable non-volatile medium, such as flash memory. Alternatively, a floppy disk, a compact disc-read only memory (CD-ROM), a magneto-optical disk (MOD), and/or a digital versatile disc (DVD) may also be used. Also, in the implementations described herein, additional input channels may be, but are not limited to, computer peripherals associated with an operator interface such as a mouse and a keyboard. Alternatively, other computer peripherals may also be used that may include, for example, but not be limited to, a scanner. Furthermore, in the exemplary embodiment, additional output channels may include, but not be limited to, an operator interface monitor.

Furthermore, as used herein, the term "real-time" refers to at least one of the time of occurrence of the associated events, the time of measurement and collection of predetermined data, the time to process the data, and the time of a system response to the events and the environment. In the implementations described herein, these activities and events occur substantially instantaneously.

The systems and methods described herein are directed to a signal processing system. The signal processing system detects a plurality of mixed signals (e.g., radar signals) using a sensor. A signal data processor communicatively coupled to the sensor uses blind source separation (BSS) and other signal processing techniques to separate and identify one or more signals of interest from the plurality of mixed signals. For example, signal parameters (e.g., frequency, amplitude, etc.) of each signal of interest are identified. The identified signals of interest are output from the signal data processor. For example, the identified signals may be output to a human machine interface for display, and/or may be output to a vehicle to facilitate controlling operation of the vehicle based on the identified signals.

The signal data processor uses filter coefficients to separate and identify signals of interest. In the system and methods described herein, parallelizing and pipelining techniques are used to promptly update filter coefficients of a tunable blind source separation filter (e.g., with a hardware latency of as low as one clock cycle). The implementations described herein also facilitate continuous filter tuning and accurate signal parameter tracking through linear interpolation from a significantly smaller lookup table relative to known systems and methods. The implementations described herein further enable continuous generation, classification, and tracking of pulsed signal parameters using less memory and computational resources than known systems and methods. The systems and methods for parallelizing and pipelining a tunable blind source separation filter described herein also provide combined parallelization and pipelining of infinite impulse response (IIR) filters with substantially similar circuit and hardware implementations for both FPGA- and ASIC-based designs.

FIG. 1 is a schematic diagram of an exemplary signal processing system 100 for generating pulse descriptor words (PDWs) using BSS. Also known as blind signal separation, BSS is used to separate (e.g., filter) one or more source signals of interest from a plurality of mixed signals. In applications including, without limitation, an underdetermined case (e.g., fewer observed signals than signal sources), BSS facilitates separating and identifying pure signals of interest from an arbitrary set of time-varying signals (e.g., radar pulses from one or more signal emitters) without relying on substantial amounts of known information about the signal emitters, signals of interest, or the signal mixing process.

In the exemplary embodiment, signal processing system 100 includes a signal data processor 101 communicatively coupled to an antenna 102. Antenna 102, in the exemplary embodiment, is a wide-area sensor 103. Signal data processor 101 includes a pre-processor 104 and a post-processor 105. Sensor 103 is configured to receive signals from radar signal emitters 106 and 107. Although two radar signal emitters 106 and 107 are shown in FIG. 1, those of skill in the art will appreciate that sensor 103 may receive signals from any number of radar signal emitters 106 and 107.

Sensor 103 is communicatively coupled to pre-processor 104 through a pre-conditioner 108. In the exemplary embodiment, pre-conditioner 108 includes a low noise amplifier 109, a band pass filter 110, and a wideband analog-to-digital converter (ADC) 111. In operation, pre-conditioner 108 is configured to convert a sensor output signal 112 received from sensor 103 into an incoming signal 113 transmitted to pre-processor 104. Each incoming signal 113 is derived from a time-varying signal received at sensor 103. Time-varying signal may include a mix of signals received from radar signal emitters 106 and 107. For example, time-varying signals may include a first radar signal 114 and a second radar signal 116.

In the exemplary embodiment, pre-processor 104 includes one or more signal denoising modules 118, and a plurality of blind source separation (BSS) modules 120. Each BSS module 120 is coupled to a single signal denoising module 118, and represents one BSS channel. A total number of BSS channels in signal processing system 100 is expressed as K. Signal denoising module 118 transmits a denoised signal 124 and a state energy signal 126 to each respective BSS module 120 (e.g., 120a, 120b, . . . , 120K) of the plurality of BSS modules 120. State energy signal 126 represents a quantity (e.g., an analog voltage level) that is proportional to an amplitude of incoming signal 113 at particular sampled time points (e.g., states).

In operation, incoming signal 113 is transmitted from pre-conditioner 108 to signal denoising module 118 where incoming signal 113 undergoes signal denoising and is subsequently transmitted as denoised signal 124 to the each BSS module 120. For example, first radar signal 114 is initially received at sensor 103 as a pulse having signal characteristics including, without limitation, a frequency and a bandwidth. In this example, a single pulse of first radar signal 114, after processing by pre-conditioner 108, is then received at signal denoising module 118 as a mixed signal (e.g., the incoming signal 113 represents a signal pulse of the first radar signal 114 and has various characteristics including, without limitation, noise and information other than the desired information of interest). Signal denoising module 118 denoises the mixed incoming signal 113 prior to transmitting denoised signal 124 having a frequency and a bandwidth (or a regular pattern of frequencies and bandwidths) to the BSS modules 120. Methods implemented by signal processing system 100 are performed in substantially real time by the devices and systems described above, and as shown and described below in further detail with reference to FIG. 2.

Further, in the exemplary embodiment, pre-processor 104 includes one or more PDW generation modules 128 coupled to each BSS module 120, and a pulse denoising module 130 coupled to each BSS module 120. PDW generation module 128 generates PDW parameter vector signals 138 based on blind source separated signals 129 received from each BSS module 120. Each PDW parameter vector signal 138 contains data representative of characteristics of interest of one of radar signals 114 and 116 derived from a singular pulse of blind source separated signal 129 (e.g., frequency, bandwidth, time of arrival, time of departure, pulse width, pulse amplitude, pulse repetition interval, and/or angle of arrival (AOA)). Pulse denoising module 130 also generates an unknown signal state space representation signal 139 based on blind source separated signals 129. Unknown signal state space representation signal 139 contains data representative of additional (e.g., non-PDW-type) characteristics of interest of one of radar signals 114 and 116 from which usable spatial information about one of radar signal emitters 106 and 107 is discernable. PDW parameter vector signals 138 and unknown signal state space representation signals 139 are transmitted to post-processor 105. Signal denoising module 118, PDW generation module 128, and pulse denoising module 130 include suitable signal filtering, signal amplification, signal modulation, signal separation, signal conditioning, and/or ADC circuitry implemented using analog and/or digital electronic circuit components. Also, in the exemplary embodiment, each BSS module 120 transmits a respective blind source separated signal 129 (e.g., 129a, 129b, . . . , 129K) to PDW generation module 128 and to pulse denoising module 130.

Post-processor 105 includes a computing device 132 that includes a memory 134. As described above, PDW generation module 128 receives blind source separated signals 129 from each respective BSS module 120. PDW generation module 128 then utilizes the blind source separated signals 129 to generate a PDW parameter vector signal 138, which is subsequently transmitted to post-processor 105. PDW parameter vector signal 138 is received by computing device 132 and stored as computer-readable data in memory 134 including, without limitation, as at least one buffered data set. Pulse denoising module 130 is also configured to receive blind source separated signals 129 from each respective BSS module 120. Pulse denoising module 130 is further configured to utilize the blind source separated signals 129 to generate the unknown signal state space representation signal 139, which is subsequently transmitted to post-processor 105. Unknown signal state space representation signal 139 is received by computing device 132 and stored as computer-readable data in memory 134 including, without limitation, as at least one buffered data set. In the exemplary embodiment, computing device 132 fetches buffered data sets from memory 134 for processing using a computer-based method employing an operating system running software executed from instruction set data also stored in memory 134 (e.g., from one or more computer-readable storage media).

Computing device 132 implements a computer-based method (e.g., from software instructions stored in one or more computer-readable storage media including, without limitation, in memory 134) to carry out operations based on data contained in at least one of PDW parameter vector signal 138 and unknown signal state space representation signal 139. Such operations include, without limitation, detecting, processing, quantifying, storing, and displaying (e.g., in human readable data form) various characteristics of at least one radar signal (e.g., signals 114 and 116) represented as data in at least one of PDW parameter vector signal 138 and unknown signal state space representation signal 139. For example, PDW parameter vector signal 138 generated by PDW generation module 128 contains a plurality of PDW vector data blocks structured in a vector form, where each PDW vector data block contains one parameter of first radar signal 114. Parameters (e.g., representative of at least one characteristic of first radar signal 114) include, without limitation, frequency, bandwidth, time of arrival, time of departure, pulse width, pulse amplitude, pulse repetition interval, and/or AOA. Computing device 132 reads PDW parameter vector signal 138 and carries out at least one of the aforementioned operations on at least one PDW vector data block of the plurality of PDW vector data blocks. Also, in the exemplary embodiment, computing device 132 reads and separates (e.g., deinterleaves) PDW parameter vector signal 138 into its constituent PDW vector data blocks, and stores fewer PDW vector data blocks in memory 134 than the total number of PDW vector data blocks contained in PDW parameter vector signal 138. Deinterleaving of PDW parameter vector signal 138 enables determining characteristics of interest of radar signals 114 and/or 116 by computing device 132 to, for example, and without limitation, accurately determine and track spatial information for radar signal emitters 106 and/or 107. In other implementations, computing device 132 reads and separates all PDW vector data blocks from one another and stores all data contained therein in memory 134. Computing device 132 performs the aforementioned operations substantially simultaneously (e.g., in real time) upon receipt of radar signals 114 and 116 by sensor 103.

Resultant data from operations performed by computing device 132 are stored in memory 134. Further, in the exemplary embodiment, computing device 132 causes post-processor 105 to transmit a data output signal 142 to a human machine interface (HMI) to facilitate at least one of an interaction, a modification, a visualization, at least one further operation, and a viewable recording of information about radar signals 114 and 116 by a user of signal processing system 100. HMI is, for example, a display 144 which receives data output signal 142 from post-processor 105. In one example, characteristics (e.g., location characteristics such as grid coordinates in a physical spatial domain) representing a physical location of radar signal emitters 106 and 107, as determined by signal processing system 100, are displayed on display 144, and are updated in substantially in real time. Data output signal 142 is also transmitted from post-processor 105 to at least one device and/or system (e.g., a vehicle 146) associated with signal processing system 100. Further, computing device 132 enables post-processor 105 to transmit, in substantially real time, an actuator control signal 148 to an actuator controller 150 included within vehicle 146 to facilitate controlling vehicle 146. For example, vehicle 146 may be a remotely and/or autonomously operated land vehicle and/or an unmanned aerial vehicle (UAV).

In one mode of operation, at least one of frequency and bandwidth information contained in respective PDW parameter vector signals 138 is displayed on display 144 along with locations of respective radar signal emitters 106 and 107 to facilitate accurate tracking of locations and association with particular radar signal emitters 106 and 107. In cases where at least one radar signal emitter 106 and 107 is mobile, display 144 is automatically updated in substantially real-time to show the location information of at least one respective mobile radar signal emitter 106 and 107. Further, computing device 132 also determines at least one of a velocity, an acceleration, a trajectory, and a track (e.g., including present and prior locations) of the at least one respective mobile radar signal emitter 106 and 107. In another mode of operation, characteristics determined by signal data processor 101 also trigger a variety of substantially real time physical actions in physical devices and systems in communication with signal processing system 100. For example, characteristics of radar signal emitters 106 and 107, including frequency and bandwidth determined by signal processing system 100, are transmitted in substantially real-time as data to actuator controller 150 in vehicle 146 (e.g., to control rudders and flaps of a UAV). If radar signal emitters 106 and 107 are unauthorized (e.g., hostile, previously undetected, etc.) radar signal emitters determined to be a threat, actuator controller 150 maneuvers vehicle 146 to avoid an area of operation of signal emitters 106 and 107 or engages signal emitters 106 and 107. As a further example, characteristics of radar signal emitters 106 and 107 determined by signal data processing methods described herein are transmitted in substantially real time in a control signal to at least one of an electronic support measure (ESM) device and an electronic warfare (EW) system associated with signal processing system 100 to direct, for example, a radar jamming signal at radar signal emitters 106 and 107 operating in the surveillable environment of sensor 103 without authorization.

In operation, each BSS module 120 of the plurality of BSS modules 120 in signal processing system 100 implements filtering methods with dynamic updating to enable generating high quality PDWs containing at least one of frequency, center frequency, bandwidth, pulse time, and pulse width information. BSS modules 120 have a pipelined and parallelized architecture, as described herein. Such improved accuracy and resolution of PDWs to track, for example, frequency and bandwidth of radar signals of interest facilitates identifying, determining, and/or analyzing radar signal emitters 106 and 107 from which associated radar signals are emitted. For example, information including, without limitation, information derived from PDWs from radar signal emitters 106 and 107 is displayed on display 144 after being transmitted thereto by post-processor 105 as data output signal 142, as described above. This improved information enables signal processing system 100 to distinguish first radar signal emitter 106 from second radar signal emitter 107. Also, for example, different radar signal emitters (e.g., first radar signal emitter 106 and second radar signal emitter 107) in a surveilled environment of sensor 103 are plotted at respective locations (e.g., grid coordinates) on display 144 (e.g., as a map).

Also, in operation, the plurality of BSS modules 120 separate a plurality of denoised signals 124. As further shown and described below with reference to FIGS. 2 and 3, each BSS module 120 contains a plurality of tunable filters, where each filter operates based on filter parameters including, without limitation, a center frequency and a bandwidth. Further, in the exemplary embodiment, pre-processor 104 includes a BSS control module 196, which facilitates controlling each respective BSS module 120 of the plurality of BSS modules 120. BSS control module 196 receives respective BSS data signals 197 (e.g., 197a, 197b, . . . , 197K) containing BSS-related information including, without limitation, frequency, bandwidth, and state, from each BSS module 120 of the plurality of BSS modules 120. Based on the BSS-related information contained in BSS data signals 197, BSS control module 196 also generates and transmits respective BSS control signals 198 (e.g., 198a, 198b, . . . , 198K) back to each respective BSS module 120 to control, for example and without limitation, a timing of receipt of denoised signal 124 and transmission of respective blind source separated signals 129 to at least one of PDW generation module 128 and pulse denoising module 130. Information contained in BSS data signals 197 and BSS control signals 198 is used by BSS control module 196 to facilitate implementation of a feedback control loop.

Figure 2:
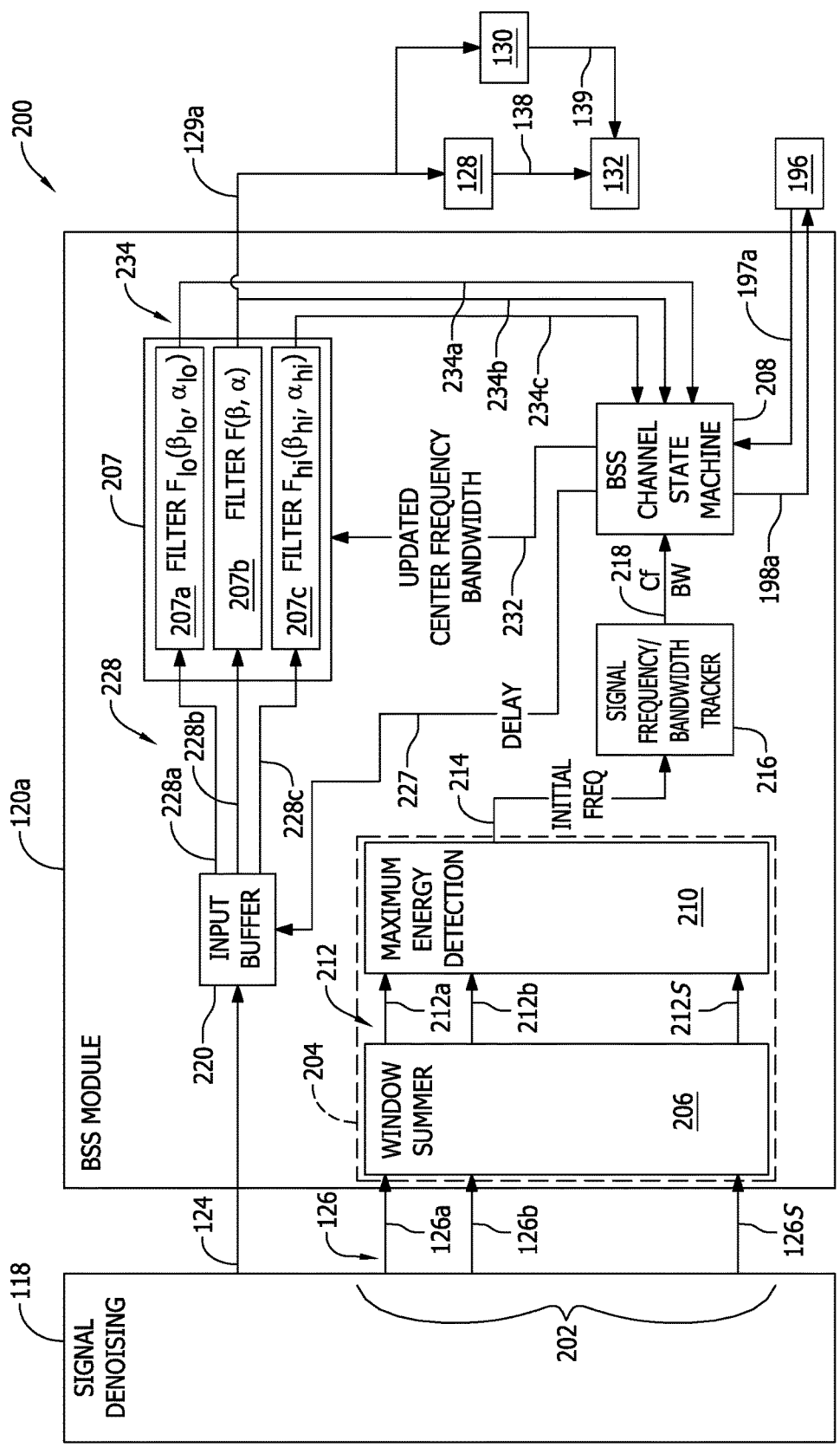
FIG. 2 is a schematic diagram of an exemplary BSS channel that forms a portion of the signal processing system shown in FIG. 1.

FIG. 2 is a schematic diagram of an exemplary BSS channel 200 (e.g., BSS module 120a receiving denoised signal 124 from signal denoising module 118) that forms a portion of the signal processing system 100 shown in FIG. 1. As described above, signal denoising module 118 transmits denoised signal 124 and state energy signal 126. Also, in the exemplary embodiment, state energy signal 126 is embodied in a plurality of state energy signals 126. Each state energy signal 126 of the plurality of state energy signals 126 contains information that is representative of the state (e.g., the analog voltage level that is proportional to the amplitude of incoming signal 113 at particular sampled time points) of a respective state output 202 of signal denoising module 118. The plurality of state energy signals 126 are received by a state energy analysis subsystem 204. State energy analysis subsystem 204 determines a center frequency (e.g., $f_0$) of respective state energy signals 126 of S signals (e.g., 126a, 126b, . . . , 126S) corresponding to S filter states of a filtering subsystem 207. State energy analysis subsystem 204 includes a window summer module 206 configured to determine a total energy within a set of S windows of length $N_e$ (e.g., one for each state of a BSS channel state machine module 208 of BSS module 120a). BSS channel state machine module 208 coordinates a timing of filtering of denoised signal 124 by filtering subsystem 207. State energy analysis subsystem 204 also includes a maximum energy detection module 210 coupled to window summer module 206. Maximum energy detection module 210 is configured to receive S summed window signals 212 (e.g., 212a, 212b, . . . , 212S) and determine a maximum energy of each summed window signal 212 of the S summed window signals 212. Maximum energy detection module 210 is further configured to determine and transmit an initial frequency signal 214 to a signal frequency and bandwidth tracker module 216 coupled to maximum energy detection module 210.

In an exemplary embodiment, initial frequency signal 214 is representative of the $f_0$ of the maximum energy of the respective state energy signal 126 corresponding to the associated state of BSS channel 200. Signal frequency and bandwidth tracker module 216 uses initial frequency signal 214 to determine a center frequency ("Cf") and a bandwidth ("BW") of the respective summed window signal 212 corresponding to the maximum energy state of BSS channel 200. Signal frequency and bandwidth tracker module 216 further outputs a Cf and BW signal 218 to BSS channel state machine module 208. BSS channel state machine module 208 is coupled to filtering subsystem 207, signal frequency and bandwidth tracker module 216, an input buffer module 220, and computing device 132. Substantially simultaneously with receipt of Cf and BW signal 218 by BSS channel state machine module 208 from signal frequency and bandwidth tracker module 216, input buffer module 220 delays filtering of denoised signal 124 by filtering subsystem 207 to enable BSS channel state machine 208 to update Cf and BW filter parameters of filtering subsystem 207 (as further described below).

In the exemplary embodiment, filtering subsystem 207 is a tunable filter bank including a plurality of filter modules including, for example, and without limitation, a low filter ("$F_{lo}$") module 207a, a main filter ("F") module 207b, and a high filter ("$F_{hi}$") module 207c. In other implementations (e.g., as shown and described below with reference to FIG. 5), filtering subsystem 207 includes greater than or less than three filter modules. Input buffer module 220 is coupled to and between filtering subsystem 207 and signal denoising module 118, and is configured to transmit a plurality of filter input signals 228 (e.g., 228a, 228b, and 228c) to respective filter modules (e.g., 207a, 207b, and 207c) in filtering subsystem 207. Input buffer module 220 is further configured to receive a delay signal 227 transmitted from a first output of BSS channel state machine module 208. Delay signal 227 dictates a timing of outputting filter input signal 228 to filtering subsystem 207. From a second output, BSS channel state machine module 208 transmits a center frequency and bandwidth update signal 232 to filtering subsystem 207. Center frequency and bandwidth update signal 232 enables continuous updating of Cf and BW operational parameters and associated filter coefficients $\alpha$ ("alpha") and $\beta$ ("beta"), respectively, of each filter module (e.g., 207a, 207b, and 207c) in filtering subsystem 207. Center frequency and bandwidth update signal 232 thus facilitates accurate tracking of denoised signal 124 frequency and bandwidth to yield a continuous and undistorted blind source separated signal 129a output from BSS module 120a and BSS channel 200.

In the exemplary embodiment, filtering subsystem 207 uses digital and/or analog electronic circuitry including, without limitation, circuits instantiated in at least one of a field-programmable gate array (FPGA) and an application-specific integrated circuit (ASIC). Also, in the exemplary embodiment, at least a portion of the methods implemented in BSS channel 200 are instantiated via software on at least one of a general purpose processor (e.g., computing device 132) and a digital signal processor (DSP). Further, in the exemplary embodiment, operational parameters of each filter module (e.g., 207a, 207b, and 207c) in filtering subsystem 207 are stored in memory 134, and are updated substantially simultaneously (e.g., in real time) with transmission of center frequency and bandwidth update signal 232 by BSS channel state machine module 208. Filter modules 207a, 207b, and 207c have both a pipelined architecture (as described below in association with FIG. 3) and a parallelized architecture (as described below in association with FIG. 4) in the exemplary embodiment.

In the exemplary embodiment, filter module $F_{lo}$ 207a, filter module F 207b, and filter module $F_{hi}$ 207c receive respective filter input signals (e.g., 228a, 228b, and 228c) from input buffer module 220, and are each further coupled to BSS channel state machine module 208. Filtering subsystem 207 is further configured to transmit a plurality of signal energy signals 234, where filter modules $F_{lo}$ 207a, F 207b, and $F_{hi}$ 207c each transmit respective signal energy signals (e.g., 234a, 234b, and 234c, respectively) to BSS channel state machine module 208. Further, in the exemplary embodiment, filter module F 207b also transmits signal energy signal 234b as the respective blind source separated signal 129a transmitted from BSS module 120a to PDW generation module 128 and to pulse denoising module 130 for further processing (e.g., deinterleaving of PDW parameter vector signal 138 by computing device 132, as shown and described above with reference to FIG. 1). Information contained in the plurality of signal energy signals 234 is used by BSS channel state machine module 208 for generating and transmitting center frequency and bandwidth update signal 232 to filtering subsystem 207 (as further shown and described below with reference to FIGS. 3 and 4).

In operation, feedback in BSS channel 200 is used to determine where (e.g., at what value or values) to place the Cf and BW of each filter module (e.g., filter modules $F_{lo}$ 207a, F 207b, and $F_{hi}$ 207c) of filtering subsystem 207 over all time. The feedback includes acquiring energy measurements resulting from existing filter settings (e.g., from signal energy signals 234a, 234b, and 234c), and continuously and adaptively updating respective filter parameters Cf and BW and filter coefficients $\alpha$ and $\beta$, while maintaining as complete a coverage in time and frequency as possible. Subsequent pulses of radar signals are filtered by filtering subsystem 207 with filter modules $F_{lo}$ 207a, F 207b, and $F_{hi}$ 207c having respective filter parameters and coefficients tuned to enable filtering subsystem 207 to multitask in a very efficient manner (e.g., under control, at least in part, of BSS control module 196, as described above with reference to FIG. 1).

Also, in operation, signal frequency and bandwidth tracker module 216 includes a tracking algorithm to track a value of the initial frequency signal 214. Specifically, the Cf of initial frequency signal 214 changes at any rate up to a maximum predetermined rate set by the tracking algorithm (e.g., determined by at least one of computing device 132, BSS channel state machine module 208, and BSS control module 196). A track window of the tracking algorithm is short enough to support a chirp rate, but long enough to handle the signal noise level. In particular, the tracking algorithm is robustly implemented by BSS channel 200 including, without limitation, in conjunction with computing device 132, as a function of all of the following: parameter and/or coefficient settings of the plurality of filter modules (e.g., 207a, 207b, and 207c), noise levels, signal frequency change characteristics, amplitude differences, and ability to pull-in signals within range required by signal denoising module 118. For example, and without limitation, where signal denoising module 118 has twenty states (e.g., S=20) with a 1 GHz bandwidth, BSS channel 200 tracks radar signals with a frequency offset from an initial frequency (e.g., pull-in range) up to ±25 MHz (e.g., 0.025 GHz).

In the exemplary embodiment, each filter module (e.g., 207a, 207b, and 207c) in filtering subsystem 207 is an infinite impulse response (IIR) filter. Also, in the exemplary embodiment, BSS channel 200 processes radar signals rather than communications signals and, therefore, the effects of a non-constant group delay caused by using IIR filters is less important than with communications signals. IIR filters adequately meet the signal quality required for post-filtering PDW deinterleaving by post-processor 105.

Filter module F 207b is used as the primary filter for separating filter input signal 228b derived from denoised signal 124. Filtering of filter input signals 228a and 228c by filter modules $F_{lo}$ 207a and $F_{hi}$ 207c, respectively, is used in the tracking process to keep filter module F 207b relatively accurate in determining both frequency and bandwidth. Also, in the exemplary embodiment, filter modules $F_{lo}$ 207a and $F_{hi}$ 207c are offset by fixed amounts in frequency and bandwidth and, as with filter module F 207b, are continuously monitored to facilitate appropriate and timely tuning of Cf and BW.

Each of the filter modules $F_{lo}$ 207a, F 207b, and $F_{hi}$ 207c are parameterized by two values (e.g., Cf and BW). In an alternative implementation, not shown, filtering subsystem 207 includes two filter modules (e.g., filter modules F 207b and $F_{hi}$ 207c), rather than three filter modules, BSS channel 200 has a fixed BW, and a simplified tracking process tracks only frequency. In this simplified case, Cf and BW of filter module F 207b are referred to as f and w, respectively, such that:

$$\text{center frequency } (F_{hi}) = f + \Delta f \quad \quad \text{Equation 1}$$

$$\text{bandwidth } (F_{hi}) = w \quad \quad \text{Equation 2}$$

For the exemplary embodiment, where filtering subsystem 207 includes three filter modules (e.g., filter modules $F_{lo}$ 207a, F 207b, and $F_{hi}$ 207c), Cf and BW of filter module F 207b are defined according to Equations 1 and 2, and Cf and BW (e.g., f and w, respectively) of filter modules $F_{lo}$ 207a and $F_{hi}$ 207c are defined as follows:

$$\text{center frequency } (F_{lo}) = f - \Delta f \quad \quad \text{Equation 3}$$

$$\text{bandwidth } (F_{lo}) = w - \Delta w \quad \quad \text{Equation 4}$$

$$\text{center frequency } (F_{hi}) = f + 2\Delta f \quad \quad \text{Equation 5}$$

$$\text{bandwidth } (F_{hi}) = w + 2\Delta w \quad \quad \text{Equation 6}$$

Also, in operation, respective signal energy signals 234 (e.g., 234a, 234b, and 234c) output by respective filter modules (e.g., filter modules $F_{lo}$ 207a, F 207b, and $F_{hi}$ 207c) in filtering subsystem 207 have their output energies determined by BSS channel state machine module 208 including, without limitation, in conjunction with methods performed using at least one of computing device 132 and BSS control module 196. For real-valued signal energy signals 234, the output energies are determined through squaring, and for complex-valued signal energy signals 234, the output energies are determined by taking the absolute value. For either real-valued or complex-valued signal energy signals 234, determination of the output energies in the case of filtering subsystem 207 having three filter modules (e.g., $F_{lo}$ 207a, F 207b, and $F_{hi}$ 207c) results in a sequence of energy measurement triples (E(n), $E_{lo}$(n), $E_{hi}$(n)), n=1, 2, ... ), where n represents the state of BSS channel 200, as described above. In the simplified two filter case, determination of the output energies of signal energy signals 234 results in a sequence of energy measurement pairs (E(n), $E_{hi}$(n)), n=1, 2, ... ), and facilitates the following updates to the Cf (e.g., f) parameters of filter modules F 207b and $F_{hi}$ 207c:

$$f \leftarrow f + \alpha_0 * [(E(n) - E_{hi}(n))/(E(n) + E_{hi}(n))] + \alpha_1 \quad \text{Equation 7}$$

In the exemplary embodiment where filtering subsystem 207 includes three filter modules (e.g., $F_{lo}$ 207a, F 207b, and $F_{hi}$ 207c), f and w parameters are updated as follows:

$$f \leftarrow f + \alpha_0 * [(E(n) - E_{lo}(n))/(E(n) + E_{lo}(n))] + \alpha_1 * [(E(n) - E_{hi}(n))/(E(n) + E_{hi}(n))] + \alpha_2 \quad \text{Equation 8}$$

$$w \leftarrow w + \beta_0 * [E(n) - E_{lo}(n)]/[E(n) + E_{lo}(n)] + \beta_1 * [(E(n) - E_{hi}(n))/(E(n) + E_{hi}(n))] + \beta_2 \quad \text{Equation 9}$$

where initial values of coefficient vectors $\alpha$ and $\beta$ are determined and stored in memory 134 during a pre-training process (e.g., implemented by at least one of computing device 132, BSS channel state machine module 208, and BSS control module 196), and are functions of window size, BW, and signal-to-noise ratio (SNR). Initial values of $\alpha$ and $\beta$ are determined from at least one of an initial denoised signal 124 and an initial state energy signal 126 received at BSS channels 200.

Referring again to FIG. 2, in operation of the exemplary embodiment, respective filter input signals (e.g., 228a, 228b, and 228c) derived from at denoised signal 124 are provided substantially simultaneously to each filter module (e.g., $F_{lo}$ 207a, F 207b, and $F_{hi}$ 207c) in filtering subsystem 207 of each BSS module 120 of the plurality of BSS modules 120 in signal processing system 100. In BSS channel 200, for example, the resulting blind source separated signal 129a output by filtering subsystem 207 is further vectorized into PDW parameter vector signal 138 by PDW generation module 128 to further facilitate accurate tracking and determination of frequency and/or bandwidth of at least one radar signal. Therefore, BSS channel 200 enables signal processing system 100 to implement high performance real time tracking of a plurality of time-varying radar signals streaming through pre-processor 104.

The aforementioned filtering methods enable signal processing system 100 to generate high quality PDW parameter vector signals 138 that are used for identifying, determining, and analyzing radar signal emitters 106 and 107. For example, PDW parameter vector signals 138 associated with radar signal emitter 106 are displayed on display 144, as described above. Also, for example, improved information about frequencies and/or bandwidths contained in at least two PDW parameter vector signals 138 enable signal processing system 100 to distinguish first radar signal emitter 106 from second radar signal emitter 107. These radar signal emitters 106 and 107 are plotted at respective locations on display 144 (e.g., as a map).

Figure 3:
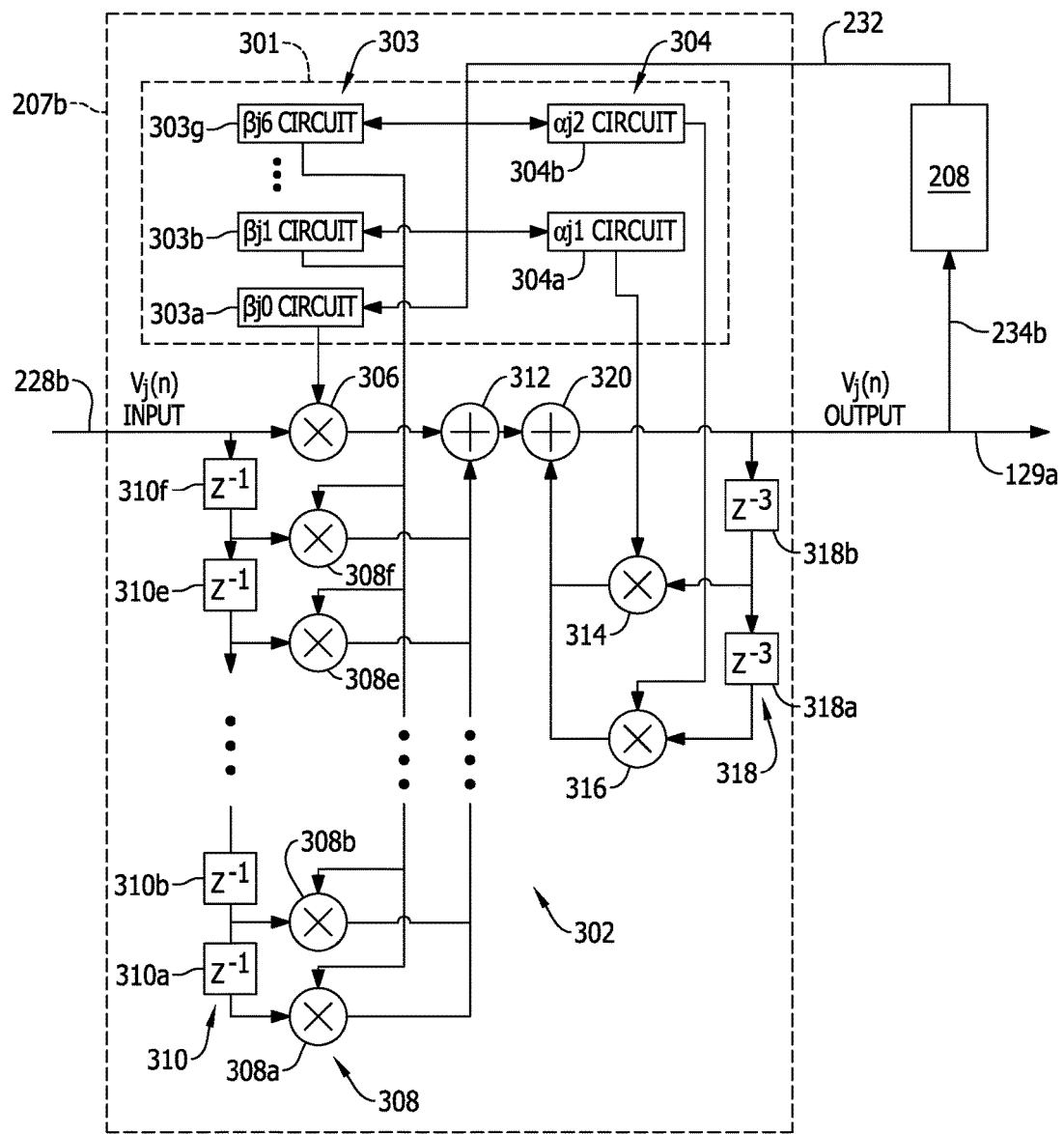
FIG. 3 is a schematic diagram of a pipelined architecture of an exemplary filter module that may be used with the filtering subsystem shown in FIG. 2.

FIG. 3 is a schematic diagram of an exemplary filter module (e.g., filter module F 207b) that may be used with the filtering subsystem 207 shown in FIG. 2. As shown in FIG. 3 and described herein, filtering subsystem 207 has a pipelined architecture. As used herein, the terms pipeline, pipelined, and pipelining refer to methods and configurations of filtering modules and related operational units which enable increasing speed and throughput in signal processing system 100 by facilitating different functional units performing different tasks concurrently. In the exemplary embodiment, filter module F 207b includes an effective sixth order IIR filter 301 configured to output the respective signal energy signal 234b to BSS channel state machine module 208. Filter modules 207a and 207c are implemented similarly in the exemplary embodiment.

In the illustrated embodiment, sixth order IIR filter 301 includes seven BW filter circuits 303 (e.g., 303a, 303b, . . . , 303g), where each BW filter circuit 303 is embodied in a second order IIR filter and has a respective β coefficient (denoted "$\beta_j 0$", "$\beta_j 1$", . . . , "$\beta_j 6$", respectively). Sixth order IIR filter 301 also includes two Cf filter circuits 304 (e.g., 304a, 304b), where each Cf filter circuit 304 is embodied in a second order IIR filter and has a respective α coefficient (denoted "$\alpha j1$" and "$\alpha j2$", respectively). Filter module F 207b also includes a pipelining architecture 302 (e.g., implemented in conjunction with at least one of computing device 132, BSS channel state machine module 208, and BSS control module 196) that facilitates pipelining the plurality of BW filter circuits 303 and the plurality of Cf filter circuits 304 by a factor of three. Thus, in the exemplary embodiment, filter module F 207b functions as a sixth order IIR filter with a transfer function having 6 zeros (e.g., 6 coefficients β in the numerator) and 2 poles (e.g., 2 coefficients α in the denominator), assuming that a value of $\alpha_j 0=1$.

In operation, coefficients α and β of BW filter circuits 303 and Cf filter circuits 304, respectively, are updated within two hardware clock cycles after receipt by filter module F 207b of a first pulse of filter input signal 228b. This updating routine is implemented by BSS channel state machine module 208 transmitting to filtering subsystem 207 the Cf and BW updated signal 232 using information contained in the plurality of signal energy signals 234 (as shown and described below with reference to FIG. 4). Information contained as data in center frequency and bandwidth update signal 232 is used by sixth order IIR filter 301 to update filter coefficients α and β of BW filter circuits 303 and Cf filter circuits 304, respectively. Upon a second and subsequent pulses of filter input signals 228b (and likewise, e.g., filter input signals 228a and 228c) received by filtering subsystem 207, updated filter coefficients α and β facilitate tracking the frequency of at least one radar signal emitter (e.g., first radar signal emitter 106) in the surveillable environment of sensor 103.

In operation, a product of a value (e.g., $V_j(n)_{input}$) of the filter input signal 228b and a value of coefficients $\beta_j 0$ of BW filter circuit 303a is determined by a first multiplier 306. Substantially simultaneously, coefficients $\beta_j 1$ through $\beta_j 6$ are transmitted from BW filter circuits 303b through 303g to a plurality of multipliers 308 (e.g., six multipliers 308a, 308b, . . . , 308f). Each multiplier 308 of the plurality of multipliers 308 also inputs a respective first order z-transform delay ($Z^{-1}$) 310 (e.g., 310a, 310b, . . . , 310f). Each $Z^{-1}$ delay 310 applies a delay value to filter input signal 228b prior to being input to each multiplier 308 of the plurality of multipliers 308. Outputs of the first multiplier 306 and each multiplier 308 of the plurality of multipliers 308 are transmitted to a first summer 312. First summer 312 determines a sum of the outputs of the first multiplier 306 and each multiplier 308 of the plurality of multipliers 308.

Substantially simultaneously with determining the value of the sum of the outputs of first multiplier 306 and each multiplier 308 of the plurality of multipliers 308, Cf filter circuits 304a and 304b transmit values of coefficients $\alpha j1$ and $\alpha j2$ to a second multiplier 314 and a third multiplier 316, respectively. Second multiplier 314 and third multiplier 316 each input a respective third order z-transform delay ($Z^{-3}$) 318 (e.g., 318a, 318b). Each $Z^{-3}$ delay 318 applies a delay value to signal energy signal 234b prior to being input to second multiplier 314 and third multiplier 316. The values of third order Z-transform delays 318 are three times the values of first order z-transform delays 310 because there are three times as many β coefficients input into each respective multiplier 308 of the plurality of multipliers 308 as there are α coefficients (assuming $\alpha_j 0=1$) input into second multiplier 314 and third multiplier 316. This enables implementation of filter module F 207b on an FPGA in addition to an ASIC. Products determined by second multiplier 314 and third multiplier 316 are transmitted to a second summer 320. Second summer 320 determines a sum of the outputs of second multiplier 314 and third multiplier 316, and the output of first summer 312. Second summer 320 thus generates signal energy signal 234b as its output.

With subsequent filter input signals 228b received by filter module F 207b, pipelining with filter coefficient update and feedback enables continuous tuning of α and β coefficients and operational parameters (including, without limitation, center frequency and bandwidth) of each BW filter circuit 303 and each Cf filter circuit 304. Given subsequent pulses of $V_j(n)_{input}$-valued filter input signals 228b (e.g., x[n]), the above-described pipelined filtering process enables filter module F 207b to output refined (e.g., tracked) signal energy signals 234b following a difference function implemented by pipelining architecture 302 as follows:

$$V_j(n)_{output} = y[n] = \Sigma_{j=1}^{N=2} \alpha_j y[n-j] + \Sigma_{j=0}^{M=6} \beta_j x[n-j] \quad \text{Equation 10}$$

where x[n] terms are individual pipelined outputs of respective multipliers 308 of the plurality of multipliers 308 (e.g., M=6) summed by the first summer 312, and y[n] terms are pipelined outputs of second multiplier 314 and third multiplier 316 (e.g., N=2) summed by second summer 320. Thus, the exemplary embodiment, a total of eight coefficients are updated (e.g., $\alpha_j 0=1$ remains constant) and a total of 1+M+N multipliers are needed to compute each new output from the difference equation after at least seven pulses of filter input signals 228b are received by filter module F 207b, thereby updating filter coefficients α and β at least 6 times.

The determination of values of signal energy signals 234b following the streaming of greater than seven filter input signal 228b pulses through filter module F 207b can be further simplified from the above difference function by the following system function, H(z):

$$H(z) = G + \sum_{i=1}^{N}\left(\frac{c_{i0}Z^{-1} + c_{i1}Z^{-2}}{1 + A_{i0}Z^{-1} + A_{i1}Z^{-2}}\right)$$ Equation 11 where H(z) is the polyphase decomposition reduced to a parallel second order IIR filter form (e.g., with M=N=2), the subsequences $x_k[n]$ composing the sum are the polyphase components of the parent sequence x[n] (for all n), and G is a constant representative of a value (e.g., the value of signal energy signal 234b at n=0 and with $\alpha_j 0=1$) derived by BSS channel state machine module 208 prior to transmitting Cf and BW update signal 232 to each BW filter circuit 303 and each Cf filter circuit 304.

Also, in operation, in the exemplary embodiment, filter module F 207b implements an interpolation process to enable determination of the final values of filter coefficients α and β to provide the aforementioned updates within two hardware clock cycles. As further shown and described below with reference to FIG. 4, the Cf and BW update signal 232 contains at least one of a frequency word and a bandwidth word including a frequency value and a bandwidth value, respectively. Substantially simultaneously with transmission of Cf and BW update signal 232 from BSS channel state machine module 208, the tracking algorithm uses a lookup and interpolation routine with a table of fixed coefficients stored in memory 134 to determine the updated filter coefficient values α and/or β by interpolation of the values from the table of fixed coefficients queried with the updated value of the frequency word and/or bandwidth word. Also, substantially simultaneously with the lookup and interpolation routine, a set of values of filter coefficients α and/or β are updated in memory 134 to enable subsequent cycles of lookup, interpolation, and update of filter coefficients α and β for subsequent instances of filter input signal 228b. Thus, in two hardware clock cycles, filter module F 207b enables signal processing system 100 to quickly and adaptively track quickly changing incoming radar signals (e.g., broad band chirps) without glitches as fast as the Cf and BW update signal 232 is transmittable from BSS channel state machine module 208, and to switch between radar signals at widely separated frequencies in real time.

Figure 4:
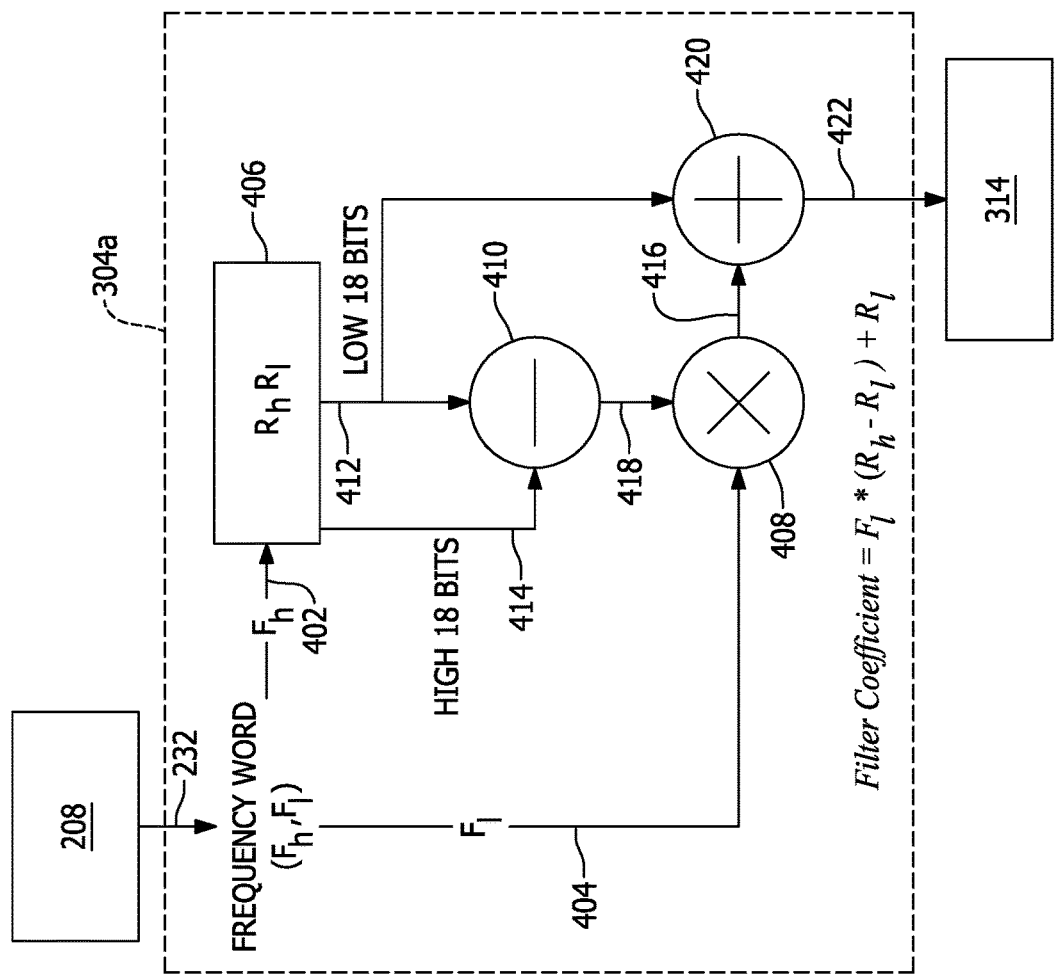
FIG. 4 is a detailed view of an exemplary filter circuit that may be used with the filter module shown in FIG. 3.

FIG. 4 is a detailed view of an exemplary filter circuit (e.g., Cf filter circuit 304a) that may be used with the filter module F 207b shown in FIG. 3. In the exemplary embodiment, BSS channel state machine module 208 transmits Cf and BW update signal 232 containing a frequency word to Cf filter circuit 304a, where the frequency word data is split into a high half bit set ($F_h$) 402 and a low half bit set ($F_l$) 404. In the exemplary embodiment, an intermediate register 406 receives thirty-six bits of $F_h$ 402, and a multiplier 408 receives $F_l$ 404. Substantially simultaneously with receipt of $F_h$ 402 by intermediate register 406, a subtracter 410 subtracts a low eighteen bits 412 of $F_h$ 402 in intermediate register 406 from a high eighteen bits 414 of $F_h$ 402 in intermediate register 406. Substantially simultaneously with receipt of $F_h$ 402 by intermediate register 406, a product 416 of $F_l$ 404 and a difference 418 between the low eighteen bits 412 and the high eighteen bits 414 is determined by multiplier 408. Next, a summer 420 determines a sum 422 of the low eighteen bits 412 and the product 416. Sum 422 represents a value of filter coefficient α for Cf filter circuit 304a (e.g., denoted as "$\alpha_j 1$" in FIG. 3) to be updated for the next cycle implemented by pipelining architecture 302 receiving a subsequent pulse of filter input signal 228b. Cf filter circuit 304a thus determines updated filter coefficient values $\alpha_j 1$ through interpolation from a table of fixed coefficients as follows:

$$\text{Filter Coefficient} = F_l * (R_h - R_l) + R_l$$ Equation 12 where $F_l$ represents the value of $F_l$ 404, $R_h$ is the value of the high eighteen bits 414 of $F_h$ 402 from intermediate register 406, and $R_l$ is the value of the low eighteen bits 412 of $F_h$ 402 from intermediate register 406. Sum 422 thus contains the updated value of $\alpha_j 1$ that is transmitted from sixth order IIR filter 301 to second multiplier 314 substantially simultaneously with transmission of a subsequent Cf and BW update signal 232 from BSS channel state machine module 208.

In the case of, for example, BW filter circuit 303a, Cf and BW update signal 232 transmitted thereto and containing bandwidth word is split into corresponding high and low half bit sets, and updated filter coefficient β values (e.g., denoted as "βj0" in FIG. 3) are determined in substantially the same manner as shown and described above for $\alpha_j 1$. In the case of BW filter circuit 303a, however, sum 422 contains the updated value of βj0 transmitted from sixth order IIR filter 301 to second multiplier 314 to first multiplier 306.

Figure 5:
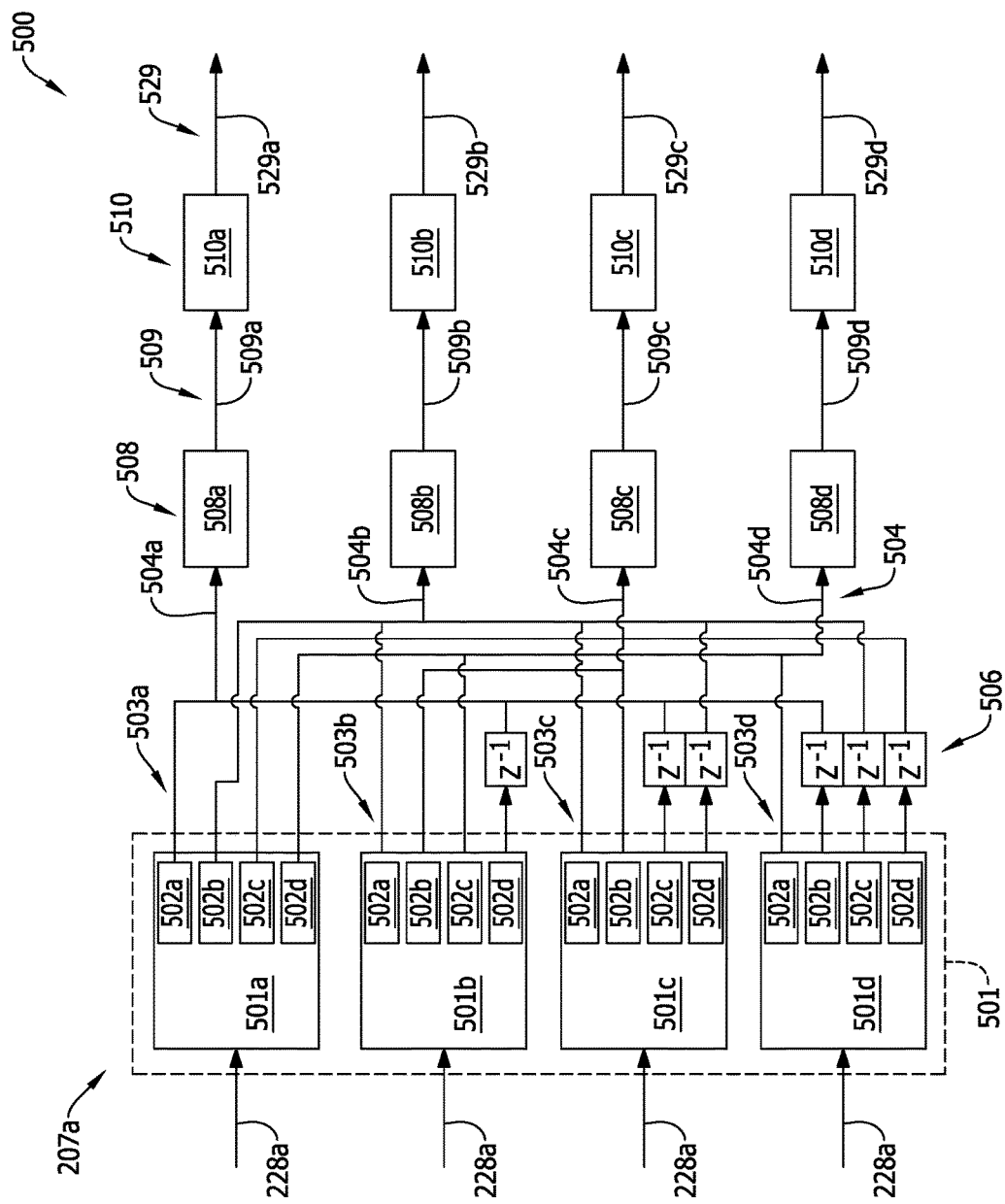
FIG. 5 is a schematic diagram of a parallelized architecture of an exemplary filter module that may be used with the filtering subsystem shown in FIG. 2.

FIG. 5 is a schematic diagram of an exemplary filter module (e.g., filter module F 207a) that may be used with the filtering subsystem 207 shown in FIG. 2. As shown in FIG. 5 and described herein, filtering subsystem 207 has a parallelized filter architecture 500. In the exemplary embodiment, parallelized filter architecture 500 includes four filter components 501 (e.g., 501a, 501b, 501c, and 501d). Each filter component 501 receives a first filter input signal 228a from input buffer module 220 (shown in FIG. 2). Separate instances of 228a may be delayed relative to one another by input buffer module 220. Parallelized filter architecture 500 is implementable in at least one of an FPGA and an ASIC to enable adaptive BSS filtering with, for example and without limitation, Bessel-type filters, and using polyphase methods for each filter input signal 228a of the plurality of filter input signals 228a. In the exemplary embodiment, parallelized filter architecture 500 implements the linear interpolation (e.g., as shown and described above with reference to FIGS. 3 and 4) on a bank of four submodules (e.g., submodules 502a, 502b, 502c, and 502d) within each of the plurality of filter components 501. The interpolation is based on the Cf parameter. BW is also adjusted for a two-dimensional interpolation, and filter submodules (e.g., 502a, 502b, 502c, and 502d) cover a consecutive frequency range for use in analyzing the four filter input signal 228a pulses.

In parallelized filter architecture 500, input buffer module 220 (shown in FIG. 2) generates a vector of four respective filter input signals 228a from consecutively received pulses of denoised signal 124 (shown in FIGS. 1 and 2). The four filter input signals 228a are then received by filter components 501a, 501b, 501c, and 501d, respectively. Each filter component 501 outputs a plurality of intermediate signal energy signals 503 as four respective intermediate signal energy signal sets 503 (e.g., 503a, 503b, 503c, and 503d). For example, and without limitation, each intermediate signal energy signal set 503 consists of four respective intermediate signal. In FIG. 5 the total of 16 submodules 502a-502d in the four filter components 501 yields the same result as filter module 207a with four parallel channels operating at ¼ the sample rate. Filter modules 207b and 207c are implemented similarly in the exemplary embodiment.

Also, in the exemplary embodiment, the four intermediate signal energy signal sets 503 are parallelized into four parallel signals 504 (e.g., 504a, 504b, 504c, and 504d). For example, intermediate signal energy signals 503 output from each filter module 502a of the four blind source separation modules 501 are combined into a first parallel signal 504a. Similarly, intermediate signal energy signals 503 output from each filter module 502b of the four blind source separation modules 501 are combined into a second parallel signal 504b, etc. Parallelized filter architecture 500 also includes a plurality of first order z-transform delay modules 506. None of the signal energy signals 234 output from the four filter modules 502a-502d of a first blind source separation module 501a include associated first order z-transform delay modules 506, while at least one respective intermediate signal energy signal 503 of a second intermediate signal energy signal set 503b, a third intermediate signal energy signal set 503c, and a fourth intermediate signal energy signal set 503d include at least one first order z-transform delay module 506 associated therewith.

Further, in the exemplary embodiment, each parallel signal 504 of the four parallel signals 504 is transmitted to a respective summing tree module 508 of four summing tree modules 508 (e.g., 508a, 508b, 508c, and 508d). Each summing tree module 508 of the four summing tree modules 508 sums the values of respective intermediate signal energy signals 503 of each respective parallel signal 504. Each summing tree module 508 of the four summing tree modules 508 is further configured to transmit a respective parallel summed signal 509 (e.g., 509a, 509b, 509c, and 509d) to a respective output register 510 of four output registers (e.g., 510a, 510b, 510c, and 510d). Respective output registers 510 transmit respective parallel signal energy signals 529 (e.g., 529a, 529b, 529c, and 529d) to BSS channel state machine module 208. (e.g., parallel signal energy signals 529 for filter module 207a correspond to signal energy signal 234a as shown and described above with reference to FIG. 2.

Upon receipt of subsequent pulses of respective filter input signals 228a by the four BSS modules 501, respective values of filter coefficients α and/or β are updated in substantially the same manner using the systems and processes shown and described above with reference to FIGS. 2-4. Thus, parallelized filter architecture 500 implements a parallelization factor of four relative to serially coupling four separate blind source separation modules 120a (shown in FIGS. 1 and 2) together. Furthermore, implementing polyphase decomposition methods (as described above with reference to FIG. 3) in parallelized filter architecture 500 with an arbitrary parallelization order P enables a single order 2 IIR tunable filter to be duplicated into an array of $P^2$ filters joined together with pipelined summing tree modules 508 that produce one vector of P values every clock period representing P consecutive filter outputs. This further enables a filter running at P times the clock rate. The numerical performance of a filter with, for example, 25 bit data and 18 bit coefficients is basically indistinguishable from a double precision version of the filter, providing improvements over known parallelization or serial filter approaches.

Figure 6:
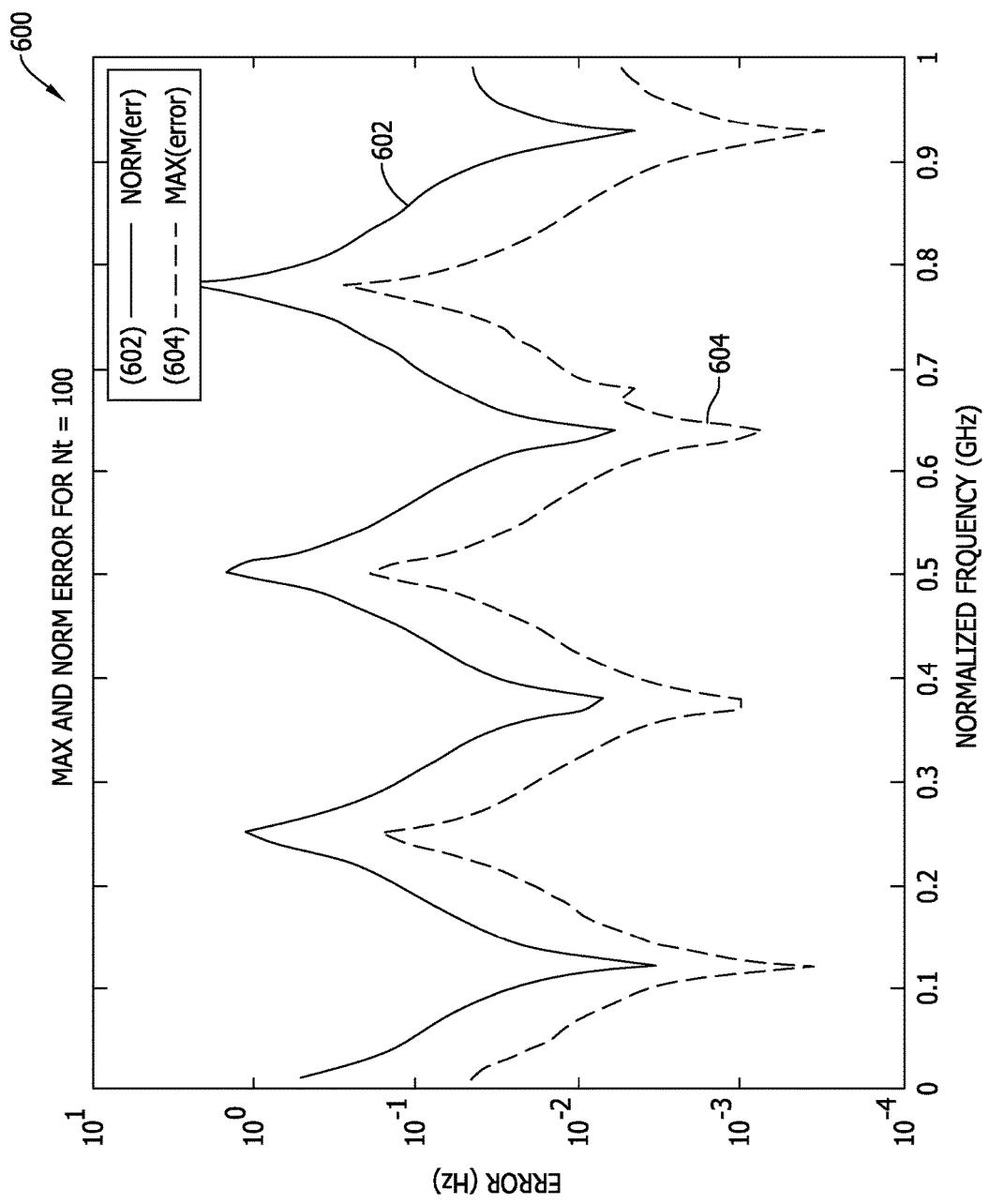
FIG. 6 is an exemplary plot of frequency tracking error (hertz, Hz) versus known normalized frequencies (GHz) in the parallelized filter architecture shown in FIG. 5 with Nt=100 for P=4, and M=4.
Figure 7:
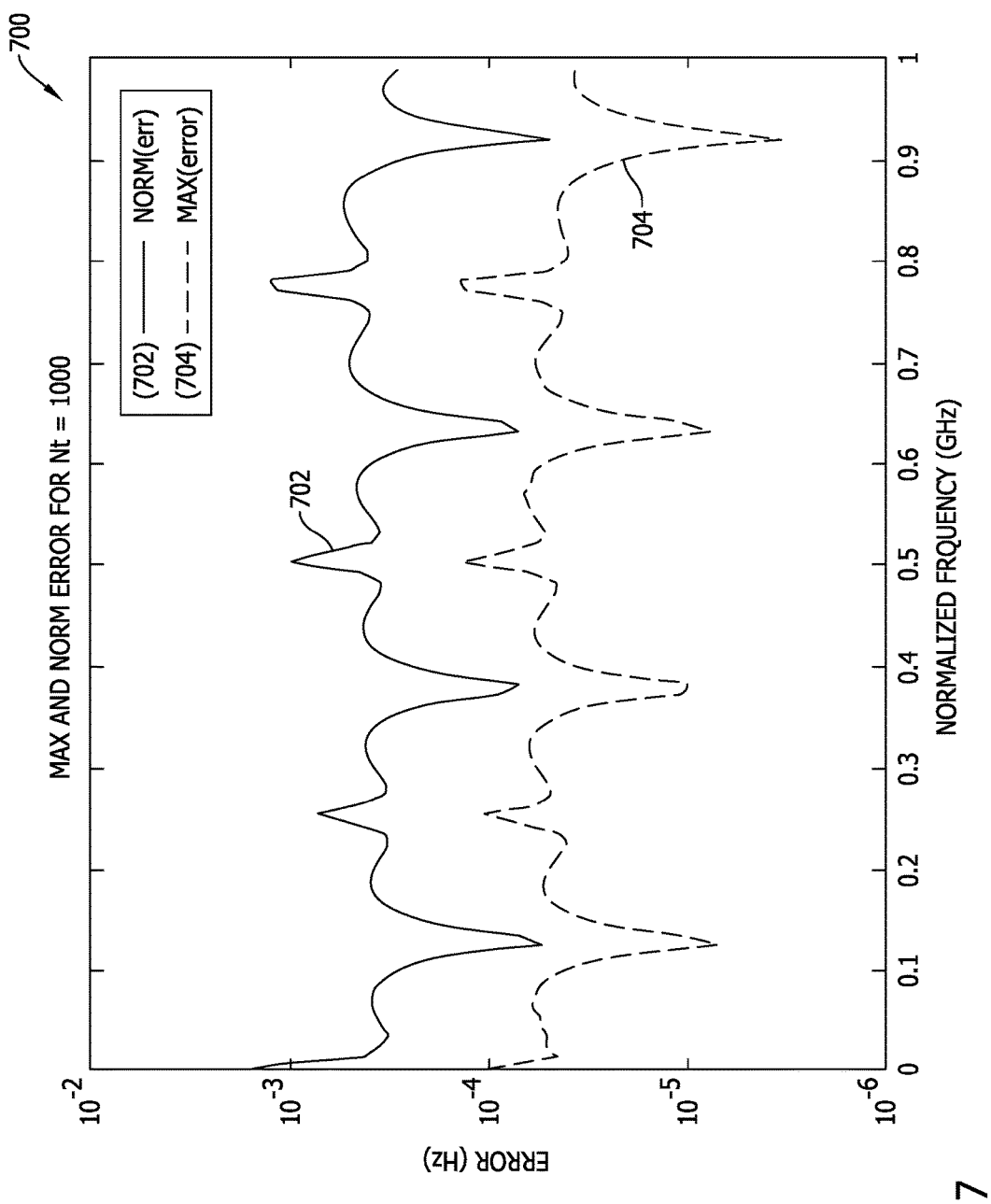
FIG. 7 is an exemplary plot of frequency tracking error (Hz) versus known normalized frequencies (GHz) in the parallelized filter architecture shown in FIG. 5 with Nt=1000 for P=4, and M=4.
Figure 8:
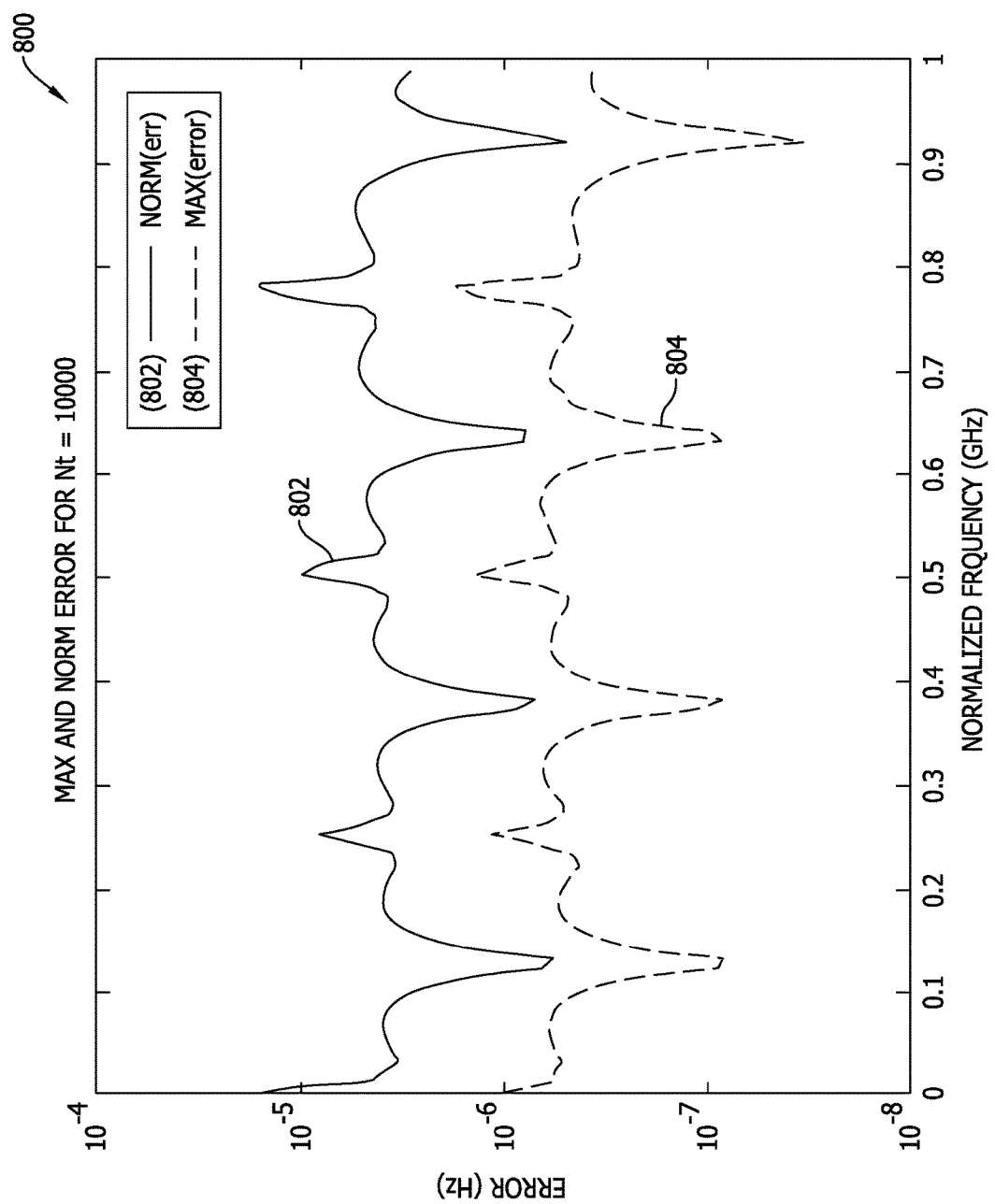
FIG. 8 is an exemplary plot of frequency tracking error (Hz) versus known normalized frequencies (GHz) in the parallelized filter architecture shown in FIG. 5 with Nt=10000 for P=4, and M=4.
Figure 9:
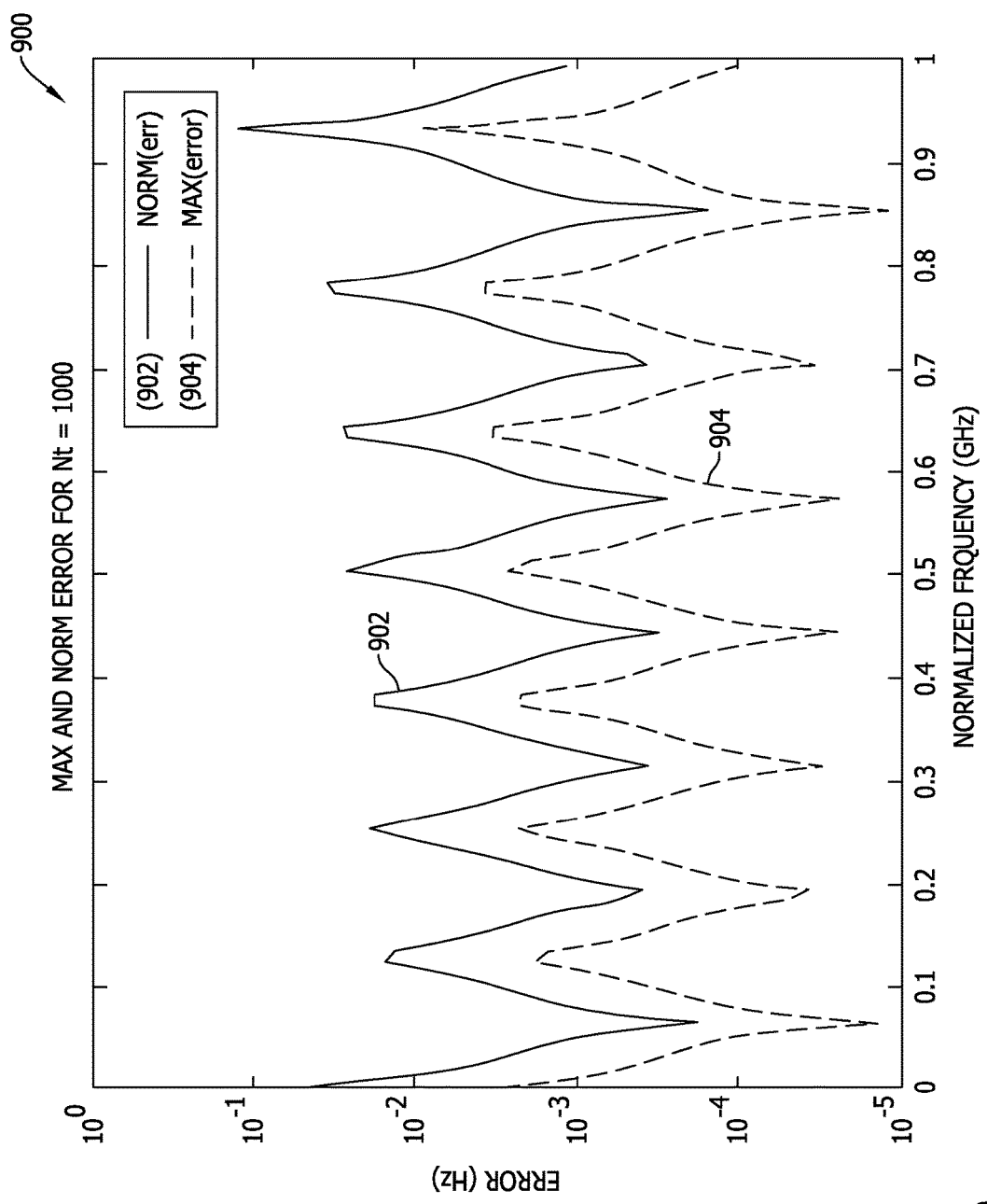
FIG. 9 is an exemplary plot of frequency tracking error (Hz) versus known normalized frequencies (GHz) in the parallelized filter architecture shown in FIG. 5 with Nt=1000 for P=8.

In operation, in the exemplary embodiment, with an infinite precision polyphase form of the plurality of filter modules (e.g., 502a, 502b, 502c, and 502d) in each of the four BSS modules 501, a search over all worst-case interpolation points chosen across the band illustrates the effect of varying frequency table sizes (e.g., Nt) and P values on performance of tunable filtering in the parallelized filter architecture 500 embodiment of signal processing system 100. To illustrate operation of the exemplary embodiment, FIG. 6 is an exemplary plot 600 of frequency tracking error (hertz, Hz) versus known normalized frequencies (GHz) in the parallelized filter architecture 500 shown in FIG. 5 with Nt=100 for P=4, and M=4. In the exemplary embodiment, a first curve 602 and a second curve 604 represent a normalized and a maximum error performance, respectively, for 100 point interpolation implemented by, for example, BSS module 501a in the parallelized filter architecture 500 implementation of signal processing system 100. FIG. 7 is an exemplary plot 700 of frequency tracking error (Hz) versus known normalized frequencies (GHz) in the parallelized filter architecture 500 shown in FIG. 5 with Nt=1000 for P=4, and M=4. In the exemplary embodiment, a third curve 702 and a fourth curve 704 represent a normalized and a maximum error performance, respectively, for 1000 point interpolation implemented by, for example, BSS module 501a in the parallelized filter architecture 500 implementation of signal processing system 100. FIG. 8 is an exemplary plot 800 of frequency tracking error (Hz) versus known normalized frequencies (GHz) in the parallelized filter architecture 500 shown in FIG. 5 with Nt=10000 for P=4, and M=4. In the exemplary embodiment, a fifth curve 802 and a sixth curve 804 represent a normalized and a maximum error performance, respectively, for 10000 point interpolation implemented by, for example, BSS module 501a in the parallelized filter architecture 500 implementation of signal processing system 100. FIG. 9 is an exemplary plot 900 of frequency tracking error (Hz) versus known normalized frequencies (GHz) in the parallelized filter architecture 500 shown in FIG. 5 with Nt=1000 for P=8. In the exemplary embodiment, a seventh curve 902 and an eighth curve 904 represent a normalized and a maximum error performance, respectively, for 1000 point interpolation implemented by, for example, BSS module 501a in the parallelized filter architecture 500 implementation of signal processing system 100.

With both of first curve 602 and second curve 604 in plot 600, the worst case reconstructed parallel signal error occurs in the transition between channels in the 100 point interpolation, which is expected since this is where filter modules (e.g., 502a, 502b, 502c, and 502d) of BSS module 501a enable accurate frequency and bandwidth tracking. The Nt=10000 case with P=4 shown in FIG. 8 illustrates a lesser error overall for the 10000 point interpolation than do plots 600 and 700 shown in FIGS. 6 and 7, respectively. With holding P constant at P=4, error decreases with increasing values of Nt in the parallelized filter architecture 500 implementation of signal processing system 100. However, as shown in FIG. 9 for the 1000 point interpolation case with P=8, overall error performance worsens by almost two orders of magnitude as compared to the Nt=1000 case with P=4 shown in FIG. 7. Thus, the operational trend for larger P is costly, entailing more intensive and less efficient usage of memory and computational resources in the parallelized filter architecture 500 implementation of signal processing system 100. Such resource usage is multiplied by the number of BSS channels 200 in use in the parallelized filter architecture 500 implementation of signal processing system 100, and further increases as P is increased.

Based on this result, in the exemplary embodiment, the frequency table employs 512 entries used in a single 18k×1 BRAM in a 512×36 bit mode for small parallelization factors such as P=1, 2, 3, 4. Larger P values require a different approach with at least one of a larger memory and greater computational power in place of the relatively small BRAM in the aforementioned exemplary embodiment. An approach to implementing parallelized filter architecture 500 in signal processing system 100 with P≥4 includes, for example, a non-uniform interpolation technique performed by BSS module 501a to address the aforementioned issue during channel transition. This first approach requires three hardware clock cycles instead of one, and still requires fairly large frequency table sizes (e.g., Nt values). In the case where a 10,000 point interpolation is employed in this first approach, the number of points is multiplied by the number of required filter coefficients α and/or β, which, even for a fairly small number of filters per BSS channel 200, makes the first approach infeasible in practice. A second approach to implementing parallelized filter architecture 500 in signal processing system 100 with P≥4 includes, for example, determination of filter coefficients α and/or β using computing device 132. This second approach necessarily requires multiple hardware clock cycles, but has the advantage of not having a non-uniform error (as shown and described above with reference to FIGS. 6-9), and is feasible in practice since the requisite circuitry in signal processing system 100 is small compared to a larger required memory 134.

Either of the two aforementioned approaches to implementing parallelized filter architecture 500 in signal processing system 100 with P≥4, or with any value of P for that matter, enables IIR filters to be used. Also, in operation, IIR-type filters are used in the first approach for implementing parallelized filter architecture 500 in signal processing system 100 for P≤4. Further, IIR-type filters are used for all filters modules (e.g., 502a, 502b, 502c, and 502d) in all four BSS modules 501 of parallelized filter architecture 500 in the second implementation approach for P>4. Where IIR filters are used in this manner, even if partial fractions decomposition is used by computing device 132 in the method, the fact that simple order 2 Bessel-type IIR filters are employed for adaptation means that there is still a rational relationship between the frequency and bandwidth, and in the coefficients α and/or β of the final combined analysis for updating and tracking thereof.

Figure 10:
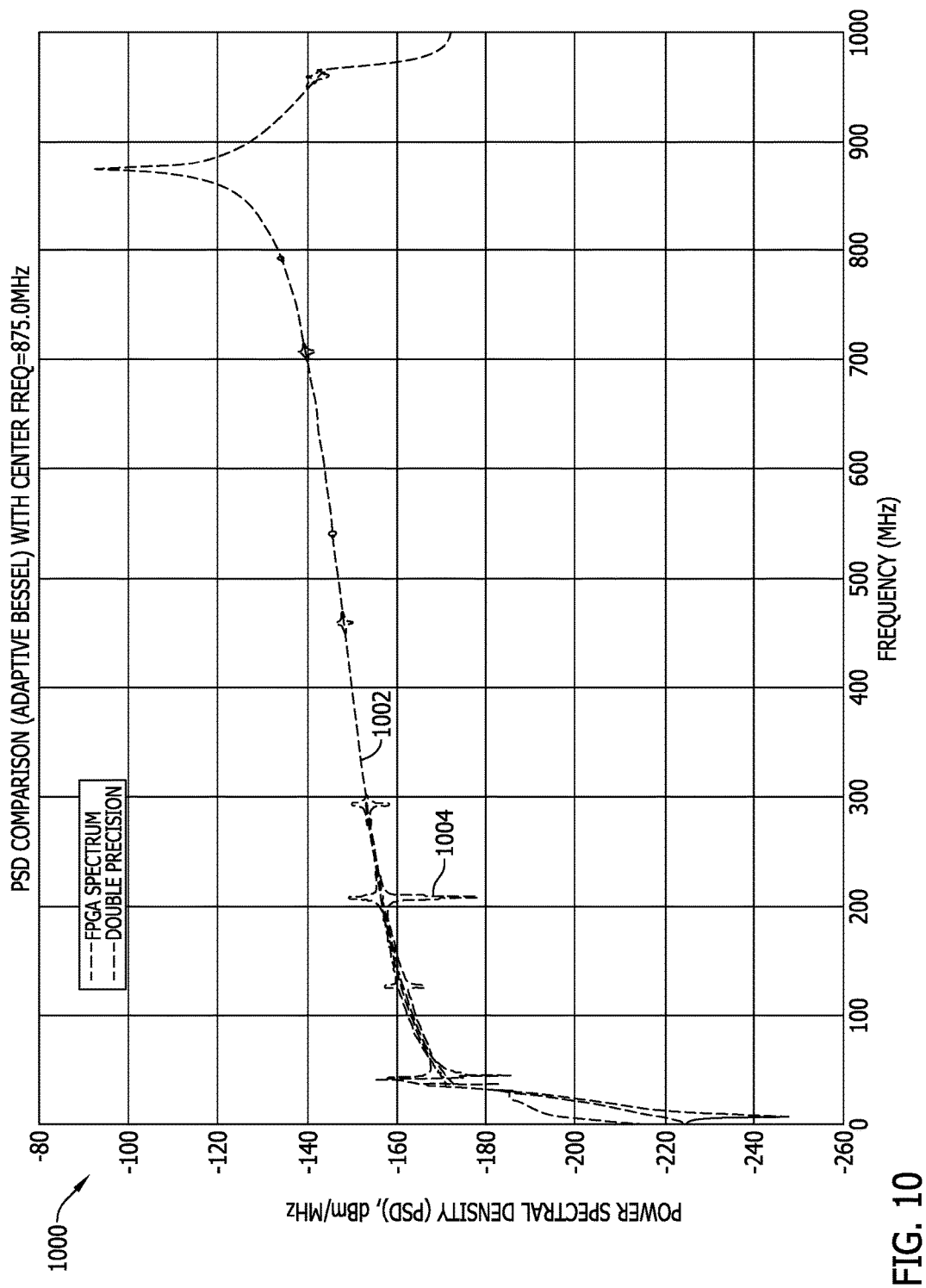
FIG. 10 is a graphical representation of operation of the signal processing system 100 shown in FIG. 1 depicting power spectral density (PSD) versus frequency for a double precision filter and a pipelined parallel fixed point filter with center frequencies of 875.0 megahertz (MHz).

FIG. 10 is a graphical representation (e.g., graph 1000) of operation of signal processing system 100 shown in FIG. 1 depicting power spectral density (PSD) versus frequency for a double precision filter and a pipelined parallel fixed point filter with center frequencies of 875.0 megahertz (MHz). In the exemplary embodiment, graph 1000 plots results for PSD amplitude (dBm/MHz, y-axis) versus tracked frequency (MHz, x-axis) using a double precision filter (plot 1002) and an FPGA implementation of signal processing system 100 with 25 bit data and 18 bit filter coefficients α and β (plot 1004). Frequency tracking performance of signal processing system 100 with pipelining and parallelization (as shown and described above) depicted in plot 1004 closely matches frequency tracking performance of the double precision filter shown in plot 1002. From frequencies of 225 MHz up to 1000 MHz, variations in PSD amplitude between plot 1002 and plot 1004 are no greater than 5 dBm/MHz. Between frequencies of 30 MHz and 225 MHz, a maximum PSD amplitude variation of 22 dBm/MHz occurs at 210 MHz, and from frequencies of 0 MHz to 30 MHz, PSD amplitude varies by up to 55 dBm/MHz at a frequency of 6 MHz.

Figure 11:
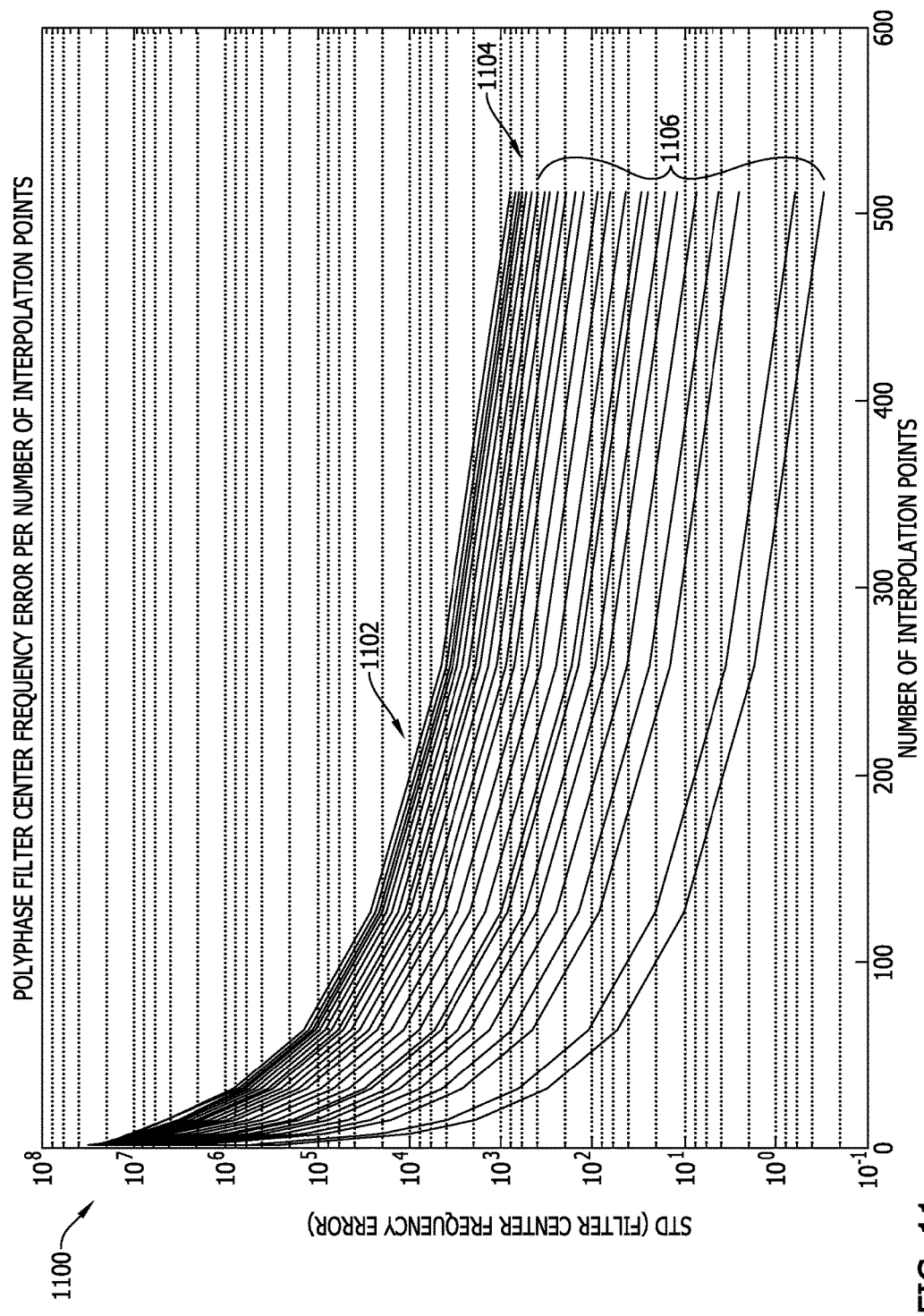
FIG. 11 is a graphical representation of operation of the parallelized filter architecture shown in FIG. 5 depicting error (Hz) of a polyphase system function-determined filter center frequency versus number of interpolation points for 28 different filter coefficients.

FIG. 11 is a graphical representation (e.g., graph 1100) of operation of parallelized filter architecture 500 shown in FIG. 5 depicting error (Hz) of polyphase system function H(z)-determined filter center frequency versus number of interpolation points for 28 different filter coefficients. A plot 1102 includes a set of 28 curves, where each curve depicts a decreasing trend in error (e.g., relative to a known center frequency value) of H(z)-determined filter center frequency as the number of interpolation points increases from 0 to 512. A first subset 1104 of curves of plot 1102 includes four curves representative of respective filter coefficients β associated with respective first multipliers 306 (e.g., denoted "$β_j0$" in BW filter circuit 303a in FIG. 3) of each BSS modules 501 of the four of BSS modules 501 shown in FIG. 5. A second subset 1106 of curves of plot 1102 includes 24 curves representative of respective filter coefficients β associated with respective multipliers 308 of the plurality of multipliers 308 (e.g., denoted "$β_j1$" ... "$β_j6$" in BW filter circuits 303b ... 303g in FIG. 3) of each BSS modules 501 of the four of BSS modules 501 shown in FIG. 5.

Within the first few interpolation points in graph 1100, a maximum error in determined filtered center frequency for each curve of the 28 curves of plot 1102 is approximately $1.8*10^7$ Hz. Error values for all curves in plot 1102 decline rapidly in a substantially exponential decay fashion from the initial few interpolation points to interpolation point 250, at which error values range between 0.1 Hz and $1.4*10^3$ Hz. Between interpolation points 250 and 512, determined center frequency error values decline more gradually than for lesser interpolation points and at interpolation point 512, with error values ranging between $1.2*10^{-1}$ Hz and $1.8*10^2$ Hz. Graph 1100 thus illustrates a wide variation in effect on certain filter coefficients β for particular BW filter circuits 303 in each BSS module 501 of the four of BSS modules 501. Furthermore, operational results such as those illustrated in graph 1100 enable users of signal processing system 100 to determine the number of points needed to be stored in memory in at least one of pre-processor 104 and post-processor 105 (e.g., for the table of fixed coefficients, described above with reference to FIG. 3) to obtain the desired accuracy for particular filter modules (e.g., 502a, 502b, 502c, and/or 502d) in each BSS modules 501 of the four of BSS modules 501.

FIG. 12 is a flowchart of an exemplary method 1200 of processing a plurality of time-varying signals (e.g., at least one of first radar signal 114 and second radar signal 116) that may be used with signal processing system 100 shown in FIG. 1. The plurality of time-varying signals are received at sensor 103 communicatively coupled to signal data processor 101, and method 1200 is used to identify at least one parameter of at least one of the plurality of time-varying signals. In the exemplary embodiment, method 1200 includes receiving 1202, at the plurality of BSS modules (e.g., BSS modules 120) of signal data processor 101, signals (e.g., at least one denoised signal 124 and at least one state energy signal 126) derived from the plurality of time-varying signals.

Method 1200 also includes generating 1204, using the plurality of BSS modules 120, the plurality of blind source separated signals 129 (e.g., 129a, 129b, ..., 129K). Method 1200 further includes transmitting 1206, based on the plurality of blind source separated signals 129, at least one PDW parameter vector signal 138 to computing device 132 of signal data processor 101. Method 1200 also includes identifying 1208, using computing device 132, the at least one parameter from the at least one PDW parameter vector signal 138. Method 1200 further includes outputting 1210 the at least one parameter from the signal data processor 101.

The above-described systems and methods for parallelizing and pipelining a tunable blind source separation filter enable determining updated filter coefficients with a hardware latency of as low as one clock cycle. The above-described implementations also facilitate continuous filter tuning and accurate signal parameter tracking through linear interpolation from a significantly smaller lookup table relative to known systems and methods. The above-described implementations further enable continuous generation, classification, and tracking of pulsed signal parameters including frequency using less memory and computational resources than known systems and methods. The above-described systems and methods for parallelizing and pipelining a tunable blind source separation filter also provide combined parallelization and pipelining of IIR filters with substantially similar circuit and hardware implementations for both FPGA- and ASIC-based designs.

An exemplary technical effect of the above-described systems and methods for parallelizing and pipelining a tunable blind source separation filter includes at least one of the following: (a) enabling determination of updated filter coefficients with a hardware latency of as low as one clock cycle; (b) facilitating continuous filter tuning and accurate signal parameter tracking through linear interpolation from a significantly smaller lookup table relative to known systems and methods; (c) enabling continuous generation, classification, and tracking of pulsed signal parameters including frequency using less memory and computational resources than known systems and methods; and (d) providing combined parallelization and pipelining of IIR filters with substantially similar circuit and hardware implements for both FPGA- and ASIC-based designs.

Although specific features of various implementations of the disclosure may be shown in some drawings and not in others, this is for convenience only. In accordance with the principles of the disclosure, any feature of a drawing may be referenced and/or claimed in combination with any feature of any other drawing.

Some implementations involve the use of one or more electronic or computing devices. Such devices typically include a processor, processing device, or controller, such as a general purpose central processing unit (CPU), a graphics processing unit (GPU), a microcontroller, a reduced instruction set computer (RISC) processor, an ASIC, a programmable logic circuit (PLC), an FPGA, a digital signal processing (DSP) device, and/or any other circuit or processing device capable of executing the functions described herein. The methods described herein may be encoded as executable instructions embodied in a computer-readable medium, including, without limitation, a storage device and/or a memory device. Such instructions, when executed by a processing device, cause the processing device to perform at least a portion of the methods described herein. The above examples are exemplary only, and thus are not intended to limit in any way the definition and/or meaning of the term processor and processing device.

This written description uses examples to disclose the implementations, including the best mode, and also to enable any person skilled in the art to practice the implementations, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A method of processing a plurality of time-varying signals received at a sensor communicatively coupled to a signal data processor to identify at least one parameter of at least one of the plurality of time-varying signals, said method comprising:
  receiving, at a plurality of blind source separation ("BSS") modules of the signal data processor, signals derived from the plurality of time-varying signals, each BSS module of the plurality of BSS modules including a filtering subsystem, wherein the filtering subsystem within each BSS module has a pipelined architecture and a parallelized architecture;
  generating, using the plurality of BSS modules, a plurality of blind source separated signals by operating each filtering subsystem in accordance with a first filter coefficient ($\alpha$) and a second filter coefficient ($\beta$);
  transmitting, based on the plurality of blind source separated signals, at least one pulse descriptor word parameter vector signal to a computing device of the signal data processor;
  continuously updating the first and second filter coefficients ($\alpha$, $\beta$) based on the at least one pulse descriptor word parameter vector signal;
  identifying, using the computing device, the at least one parameter from the at least one pulse descriptor word parameter vector signal; and
  outputting the at least one parameter from the signal data processor.

2. The method in accordance with claim 1, wherein receiving signals comprises receiving denoised signals and state energy signals from at least one signal denoising module.

3. The method in accordance with claim 1, wherein generating a plurality of blind source separated signals comprises generating the plurality of blind source separated signals using a plurality of summing tree modules.

4. The method in accordance with claim 1, wherein each filtering subsystem includes a plurality of filtering modules.

5. The method in accordance with claim 1, wherein outputting the at least one parameter from the signal data processor comprises directing movement of a vehicle based on the at least one parameter.

6. The method in accordance with claim 1, wherein outputting the at least one parameter from the signal data processor comprises displaying the at least one parameter on a display.

7. A system for processing a plurality of time-varying signals to identify at least one parameter of at least one of the plurality of time-varying signals, said system comprising:
  a sensor configured to receive the plurality of time-varying signals; and
  a signal data processor communicatively coupled to said sensor and comprising a plurality of blind source separation ("BSS") modules, each BSS module of said plurality of BSS modules comprising a filtering subsystem, wherein said filtering subsystem within each BSS module has a pipelined architecture and a parallelized architecture, said signal data processor configured to:
    receive, at said plurality of BSS modules, signals derived from the plurality of time-varying signals;
    generate, using the plurality of BSS modules, a plurality of blind source separated signals by operating each filtering subsystem in accordance with a first filter coefficient (α) and a second filter coefficient (β);

transmit, based on the plurality of blind source separated signals, at least one pulse descriptor word parameter vector signal to a computing device of said signal data processor;

continuously update the first and second filter coefficients (α, β) based on the at least one pulse descriptor word parameter vector signal;

identify, using the computing device, the at least one parameter from the at least one pulse descriptor word parameter vector signal; and output the at least one parameter from said signal data processor.

8. The system in accordance with claim 7, wherein said signal data processor further comprises at least one signal denoising module configured to provide the signals to said plurality of BSS modules.

9. The system in accordance with claim 7, wherein said signal data processor further comprises a plurality of summing tree modules.

10. The system in accordance with claim 7, wherein each filtering subsystem comprises a plurality of filtering modules.

11. The system in accordance with claim 7, wherein to output the at least one parameter, said signal data processor is configured to direct movement of a vehicle based on the at least one parameter.

12. The system in accordance with claim 7, wherein to output the at least one parameter, said signal data processor is configured to display the at least one parameter on a display.

13. A signal data processor for processing a plurality of time-varying signals to identify at least one parameter of at least one of the plurality of time-varying signals, said signal data processor comprising:

a plurality of blind source separation ("BSS") modules, each BSS module of said plurality of BSS modules comprising a filtering subsystem, wherein said filtering subsystem within each BSS module has a pipelined architecture and a parallelized architecture, said signal data processor configured to:

receive, at said plurality of BSS modules, signals derived from the plurality of time-varying signals;

generate, using the plurality of BSS modules, a plurality of blind source separated signals by operating each filtering subsystem in accordance with a first filter coefficient (α) and a second filter coefficient (β);

transmit, based on the plurality of blind source separated signals, at least one pulse descriptor word parameter vector signal to a computing device of said signal data processor;

continuously update the first and second filter coefficients (α, β) based on the at least one pulse descriptor word parameter vector signal;

identify, using the computing device, the at least one parameter from the at least one pulse descriptor word parameter vector signal; and output the at least one parameter from said signal data processor.

14. The signal data processor in accordance with claim 13, wherein said signal data processor further comprises at least one signal denoising module configured to provide the signals to said plurality of BSS modules.

15. The signal data processor in accordance with claim 13, wherein said signal data processor further comprises a plurality of summing tree modules.

16. The signal data processor in accordance with claim 13, wherein each filtering subsystem comprises a plurality of filtering modules.

17. A method of processing a plurality of time-varying signals received at a sensor communicatively coupled to a signal data processor to identify at least one parameter of at least one of the plurality of time-varying signals, said method comprising:

receiving, at a plurality of blind source separation ("BSS") modules of the signal data processor, signals derived from the plurality of time-varying signals, each BSS module of the plurality of BSS modules including a filtering subsystem, wherein the filtering subsystem within each BSS module has a pipelined architecture and a parallelized architecture;

generating, using the plurality of BSS modules, a plurality of blind source separated signals by operating each filtering subsystem in accordance with a set of filter coefficients;

transmitting, based on the plurality of blind source separated signals, at least one pulse descriptor word parameter vector signal to a computing device of the signal data processor;

continuously updating the filter coefficients based on the at least one pulse descriptor word parameter vector signal;

identifying, using the computing device, the at least one parameter from the at least one pulse descriptor word parameter vector signal; and outputting the at least one parameter from the signal data processor.

18. The method in accordance with claim 17, wherein each filtering subsystem includes a plurality of filtering modules.

19. The method in accordance with claim 17, wherein outputting the at least one parameter from the signal data processor comprises directing movement of a vehicle based on the at least one parameter.

20. The method in accordance with claim 17, wherein outputting the at least one parameter from the signal data processor comprises displaying the at least one parameter on a display.

* * * * *